US011846692B2

(12) United States Patent
Dou et al.

(10) Patent No.: US 11,846,692 B2
(45) Date of Patent: Dec. 19, 2023

(54) MOTION COMPENSATION FOR MRI IMAGING

(71) Applicant: University of Virginia Patent Foundation, Charlottesville, VA (US)

(72) Inventors: Quan Dou, Charlottesville, VA (US); Zhixing Wang, Charlottesville, VA (US); Xue Feng, Zion Crossroads, VA (US); John P. Mugler, III, Charlottesville, VA (US); Craig H. Meyer, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 20 days.

(21) Appl. No.: 17/733,967

(22) Filed: Apr. 29, 2022

(65) Prior Publication Data
US 2022/0373630 A1  Nov. 24, 2022

Related U.S. Application Data

(60) Provisional application No. 63/181,289, filed on Apr. 29, 2021.

(51) Int. Cl.
*G01R 33/56* (2006.01)
*G01R 33/565* (2006.01)
*G06T 7/262* (2017.01)

(52) U.S. Cl.
CPC ... *G01R 33/5608* (2013.01); *G01R 33/56509* (2013.01); *G06T 7/262* (2017.01);
(Continued)

(58) Field of Classification Search
None
See application file for complete search history.

(56) References Cited

U.S. PATENT DOCUMENTS

2020/0033431 A1* 1/2020 Schlemper ............. A61B 5/055
2022/0187406 A1* 6/2022 Wang ............... G01R 33/56509

OTHER PUBLICATIONS

Andre JB, Bresnahan BW, Mossa-Basha M, et al. Toward Quantifying the Prevalence, Severity, and Cost Associated With Patient Motion During Clinical MR Examinations. J Am Coll Radiol. 2015;12(7):689-695.
(Continued)

*Primary Examiner* — Douglas X Rodriguez
(74) *Attorney, Agent, or Firm* — Meunier Carlin & Curfman LLC

(57) ABSTRACT

Training a neural network to correct motion-induced artifacts in magnetic resonance images includes acquiring motion-free magnetic resonance image (MRI) data of a target object and applying a spatial transformation matrix to the motion-free MRI data. Multiple frames of MRI data are produced having respective motion states. A Non-uniform Fast Fourier Transform (NUFFT) can be applied to generate respective k-space data sets corresponding to each of the multiple frames of MRI; the respective k-space data sets can be combined to produce a motion-corrupted k-space data set and an adjoint NUFFT can be applied to the motion-corrupted k-space data set. Updated frames of motion-corrupted MRI data can be formed. Using the updated frames of motion corrupted MRI data, a neural network can be trained that generates output frames of motion free MRI data; and the neural network can be saved.

25 Claims, 23 Drawing Sheets

(52) U.S. Cl.
CPC ............... *G06T 2207/10088* (2013.01); *G06T 2207/20084* (2013.01)

(56) References Cited

OTHER PUBLICATIONS

Batchelor PG, Atkinson D, Irarrazaval P, Hill DL, Hajnal J, Larkman D. Matrix description of general motion correction applied to multishot images. Magn Reson Med. 2005;54(5):1273-1280.

Bullitt E, Zeng D, Gerig G, Aylward S, Joshi S, Smith JK, Lin W, Ewend MG. Vessel tortuosity and brain tumor malignancy: a blinded study. Academic radiology. Oct. 1, 2005;12(10):1232-40.

Chartsias A, Joyce T, Giuffrida MV, Tsaftaris SA. Multimodal MR Synthesis via Modality-Invariant Latent Representation. IEEE Trans Med Imaging. 2018;37(3):803-814.

Çiçek, Özgün, et al. "3D U-Net: learning dense volumetric segmentation from sparse annotation." Medical Image Computing and Computer-Assisted Intervention—MICCAI 2016: 19th International Conference, Athens, Greece, Oct. 17-21, 2016, Proceedings, Part II 19. Springer International Publishing, 2016.

Cole EK, Pauly JM, Vasanawala SS, Ong F. Unsupervised MRI Reconstruction with Generative Adversarial Networks. 2020. arXiv:2008.13065 [eess.IV].

Ehman RL, Felmlee JP. Adaptive technique for high-definition MR imaging of moving structures. *Radiology*. 1989;173(1):255-263.

Eun DI, Jang R, Ha WS, Lee H, Jung SC, Kim N. Deep-learning-based image quality enhancement of compressed sensing magnetic resonance imaging of vessel wall: comparison of self-supervised and unsupervised approaches. Sci Rep. 2020;10(1):13950.

Feng X, Salerno M, Kramer CM, Meyer CH. Non-Cartesian balanced steady-state free precession pulse sequences for real-time cardiac MRI. Magn Reson Med. 2016;75(4):1546-1555.

Fessler JA. Michigan Image Reconstruction Toolbox. Available at https://web.eecs.umich.edu/~fessler/code/.

Fessler JA. On NUFFT-based gridding for non-Cartesian MRI. J Magn Reson. 2007;188(2):191-195.

Fessler, J. A., & Sutton, B. P. (2003). Nonuniform fast Fourier transforms using min-max interpolation. IEEE transactions on signal processing, 51(2), 560-574.

Fielden SW, Feng X, Zhao L, et al. A spiral-based volumetric acquisition for MR temperature imaging. Magn Reson Med. 2018;79(6):3122-3127.

Fu ZW, Wang Y, Grimm RC, et al. Orbital navigator echoes for motion measurements in magnetic resonance imaging. Magn Reson Med. 1995;34(5):746-753.

Haskell MW, Cauley SF, Bilgic B, et al. Network Accelerated Motion Estimation and Reduction (NAMER): Convolutional neural network guided retrospective motion correction using a separable motion model. Magn Reson Med. 2019;82(4):1452-1461.

Hu X, Kim SG. Reduction of signal fluctuation in functional MRI using navigator echoes. *Magn Reson Med.* May 1994;31(5):495-503.

Isola P, Zhu JY, Zhou T, Efros AA. Image-to-image translation with conditional adversarial networks. 2016. arXiv:1611.07004 [cs.CV].

Isola, P., Zhu, J. Y., Zhou, T., & Efros, A. A. (2017). Image-to-image translation with conditional adversarial networks. In Proceedings of the IEEE conference on computer vision and pattern recognition (pp. 1125-1134).

Jiang D, Dou W, Vosters L, Xu X, Sun Y, Tan T. Denoising of 3D magnetic resonance images with multi-channel residual learning of convolutional neural network. Jpn J Radiol. 2018;36(9):566-574.

Johnson PM, Drangova M. Conditional generative adversarial network for 3D rigid-body motion correction in MRI. Magn Reson Med. 2019;82(3):901-910.

Johnson PM, Liu J, Wade T, Tavallaei MA, Drangova M. Retrospective 3D motion correction using spherical navigator echoes. Magn Reson Imaging. 2016;34(9):1274-1282.

Kingma DP, Ba J. Adam: A method for stochastic optimization. arXiv preprint arXiv:1412.6980. Dec. 22, 2014.

Küstner T, Armanious K, Yang J, Yang B, Schick F, Gatidis S. Retrospective correction of motion-affected MR images using deep learning frameworks. Magn Reson Med. 2019;82(4):1527-1540.

Lee J, Kim B, Park H. MC2-Net: motion correction network for multi-contrast brain MRI. Magn Reson Med. 2021;86(2):1077-1092.

Lim Y, Bliesener Y, Narayanan S, Nayak KS. Deblurring for spiral real-time MRI using convolutional neural networks. Magn Reson Med. 2020;84(6):3438-3452.

Liu C, Bammer R, Kim DH, Moseley ME. Self-navigated interleaved spiral (SNAILS): application to high-resolution diffusion tensor imaging. Magn Reson Med. 2004;52(6):1388-1396.

Lorch B, Vaillant G, Baumgartner C, Bai W, Rueckert D, Maier A. Automated Detection of Motion Artefacts in MR Imaging Using Decision Forests. Journal of medical engineering. 2017;2017.

Maclaren J, Herbst M, Speck O, Zaitsev M. Prospective motion correction in brain imaging: a review. Magn Reson Med. 2013;69(3):621-636.

Mao X, Li Q, Xie H, Lau RYK, Wang Z, Smolley SP. Least Squares Generative Adversarial Networks. 2016. arXiv:1611.04076 [cs.CV].

Meyer CH, Hu BS, Nishimura DG, Macovski A. Fast spiral coronary artery imaging. Magn Reson Med. 1992;28(2):202-213.

Meyer CH, Pauly JM, Macovski A. A rapid, graphical method for optimal spiral gradient design. In Proceedings of the 4th Annual Meeting of ISMRM, New York, USA, 1996. p. 392.

Nishimura DG, Irarrazabal P, Meyer CH. A velocity k-space analysis of flow effects in echo-planar and spiral imaging. Magn Reson Med. 1995;33(4):549-556.

Noll DC, Cohen JD, Meyer CH, Schneider W. Spiral K-space MR imaging of cortical activation. J Magn Reson Imaging. 1995;5(1):49-56.

Ong F, Lustig M. SigPy: A Python Package for High Performance Iterative Reconstruction. In Proceedings of the 27th Annual Meeting of ISMRM, Montreal, Canada, 2019. p. 4819.

Paszke A, Gross S, Massa F, et al. PyTorch: An Imperative Style, High-Performance Deep Learning Library. 2019. arXiv:1912.01703 [cs.LG].

Qin L, van Gelderen P, Derbyshire JA, et al. Prospective head-movement correction for high-resolution MRI using an in-bore optical tracking system. Magn Reson Med. 2009;62(4):924-934.

Ronneberger O, Fischer P, Brox T. U-net: convolutional networks for biomedical image segmentation. 2015. arXiv:1505.04597 [cs.CV].

Sachs TS, Meyer CH, Hu BS, Kohli J, Nishimura DG, Macovski A. Real-time motion detection in spiral MRI using navigators. Magn Reson Med. 1994;32(5):639-645.

Schlemper J, Caballero J, Hajnal JV, Price AN, Rueckert D. A Deep Cascade of Convolutional Neural Networks for Dynamic MR Image Reconstruction. IEEE Trans Med Imaging. 2018;37(2):491-503.

Tisdall MD, Hess AT, Reuter M, Meintjes EM, Fischl B, van der Kouwe AJ. Volumetric navigators for prospective motion correction and selective reacquisition in neuroanatomical MRI. Magn Reson Med. 2012;68(2):389-399.

van der Kouwe AJ, Benner T, Dale AM. Real-time rigid body motion correction and shimming using cloverleaf navigators. Magn Reson Med. 2006;56(5):1019-1032.

Wang Z, Bovik AC, Sheikh HR, Simoncelli EP. Image quality assessment: from error visibility to structural similarity. IEEE Trans Image Process. 2004;13(4):600-612.

Welch EB, Manduca A, Grimm RC, Ward HA, Jack CR Jr. Spherical navigator echoes for full 3D rigid body motion measurement in MRI. Magn Reson Med. 2002;47(1):32-41.

Weller DS, Wang L, Mugler JP 3rd, Meyer CH. Motion-compensated reconstruction of magnetic resonance images from undersampled data. Magn Reson Imaging. 2019;55:36-45.

Zaitsev M, Dold C, Sakas G, Hennig J, Speck O. Magnetic resonance imaging of freely moving objects: prospective real-time motion correction using an external optical motion tracking system. Neuroimage. 2006;31(3):1038-1050.

Zaitsev M, Maclaren J, Herbst M. Motion artifacts in MRI: A complex problem with many partial solutions. J Magn Reson Imaging. 2015;42(4):887-901.

(56) References Cited

OTHER PUBLICATIONS

Zhang K, Zuo W, Chen Y, Meng D, Zhang L. Beyond a gaussian denoiser: Residual learning of deep cnn for image denoising. IEEE Transactions on Image Processing. Jul. 2017;26(7):3142-55.

Zhao H, Gallo O, Frosio I, Kautz J. Loss functions for image restoration with neural networks. IEEE Transactions on Computational Imaging. Mar. 2017;3(1):47-57.

* cited by examiner

|  | | Motion-corrupted images | Outputs of CNN trained with L1 loss function | Outputs of CNN trained with L2 loss function |
|---|---|---|---|---|
| Cartesian | RMSE (Mean ± SD) | 0.0210 ± 0.0032 | 0.0141 ± 0.0021 | 0.0148 ± 0.0022 |
|  | SSIM (Mean ± SD) | 0.9208 ± 0.0298 | 0.9757 ± 0.0273 | 0.9727 ± 0.0272 |
| Spiral | RMSE (Mean ± SD) | 0.0169 ± 0.0026 | 0.0123 ± 0.0019 | 0.0128 ± 0.0018 |
|  | SSIM (Mean ± SD) | 0.9369 ± 0.0289 | 0.9762 ± 0.0269 | 0.9734 ± 0.0268 |

FIG. 7

|  |  | SSIM | PSNR | RMSE× $10^{-2}$ | ABSD× $10^{-3}$ |
|---|---|---|---|---|---|
| Cartesian | motion-corrupted | 0.681 | 25.191 | 5.810 | 4.223 |
|  | motion-compensated | 0.921 | 30.811 | 3.000 | 1.792 |
| UDspiral | motion-corrupted | 0.554 | 25.297 | 5.642 | 4.439 |
|  | motion-compensated | 0.918 | 31.159 | 2.872 | 1.752 |
| VDspiral | motion-corrupted | 0.617 | 26.453 | 4.987 | 3.898 |
|  | motion-compensated | 0.935 | 32.399 | 2.492 | 1.534 |
| DDspiral | motion-corrupted | 0.618 | 26.672 | 4.870 | 3.795 |
|  | motion-compensated | 0.934 | 32.427 | 2.487 | 1.532 |

FIG. 11

| parameter | value |
|---|---|
| number of spiral interleaves | randomly selected from {8, 16, 32, 64, 128} |
| type of spiral trajectory | randomly selected from {constant density, variable density, dual density} |
| variable density | started at 1.2 and ended at 0.8 |
| dual density | started at 2.0 and ended at 0.6 |
| number of motion events | randomly selected from {1, 2, 3} |
| in-plane horizontal and vertical translations | sampled from a normal distribution with mean = 0 mm and standard deviation = 3 mm |
| in-plane rotation | sampled from a normal distribution with mean = 0° and standard deviation = 3° |
| in-plane horizontal and vertical translations for training augmentation | sampled from a uniform distribution with min = -5 mm and max = 5 mm |
| in-plane rotation for training augmentation | sampled from a uniform distribution with min = -5° and max = 5° |
| horizontal/vertical flip for training augmentation | randomly set to true or false |

FIG. 12C

|  | motion-corrupted | motion-compensated |
|---|---|---|
| NRMSE (mean ± std) | 0.3439 ± 0.1097 | 0.2050† ± 0.0888 |
| PSNR (mean ± std) | 25.12 ± 2.94 | 27.78† ± 4.01 |
| SSIM (mean ± std) | 0.5807 ± 0.1369 | 0.8505† ± 0.0825 |

† The difference of this metric before and after motion compensation is significant ($P < 0.005$).

FIG. 14B

| parameter | distribution and range |
|---|---|
| type of spiral trajectory | random sample from [constant density, variable density, dual density] |
| number of spiral interleaves | random sample from [16, 32, 64, 128] |
| percentage of motion affected spiral interleaves | uniform distribution from 0 to 50% |
| in-plane translation | normal distribution with mean = 0 mm and standard deviation = 3 mm |
| in-plane rotation | normal distribution with mean = 0° and standard deviation = 3° |

FIG. 18

MOTION COMPENSATION FOR MRI IMAGING

CROSS-REFERENCE TO RELATED APPLICATION

This Application claims priority to and benefit of U.S. Provisional Patent Application Ser. No. 63/181,289 entitled "System and method for retrospective motion compensation for spiral brain imaging with a deep convolutional neural network (DCNN)" filed Apr. 29, 2021, which is hereby incorporated by reference herein in its entirety as if fully set forth below.

STATEMENT OF GOVERNMENT INTEREST

This invention was made with government support under Grant No. R01 EB028773 by the National Institute of Biomedical Imaging and Bioengineering. The government has certain rights in the invention.

FIELD

The present disclosure relates to systems and methods for motion compensation in magnetic resonance images using neural networks.

BACKGROUND

Magnetic resonance imaging (MRI) is an important diagnostic tool for various conditions, including brain conditions. Because of the good soft tissue contrast, non-invasiveness and lack of ionizing radiation of MRI, it is widely used as a diagnostic tool for brain conditions including stroke, tumors, multiple sclerosis (MS), hemorrhage, blood vessel issues, and neurodegenerative diseases. A clinical protocol often includes pre- and post-contrast T1, T2, fluid-attenuated inversion recovery (FLAIR), proton density (PD) and diffusion weighted images (DWI). Other advanced sequences such as magnetic resonance angiography (MRA) and perfusion MRI using dynamic susceptibility contrast (DSC) and arterial spin labelling (ASL) are also used for specific conditions.

During MRI acquisition, subject motion can severely degrade the resulting images by introducing ghosting and blurring, which can lead to serious confounding effects for subsequent diagnoses. Among other needs, there is a need for motion compensation techniques that can be applied to MRI images. It is with respect to these and other considerations that the various embodiments described below are presented.

SUMMARY

In one aspect, the present disclosure relates to a computer-implemented method of training a neural network to correct motion-induced artifacts in magnetic resonance images. In one embodiment, the computer implemented method includes acquiring original frames of motion-free magnetic resonance image (MRI) data of a target object; applying a spatial transformation matrix to the original frames of motion-free MRI data and producing multiple frames of spiral MRI data having respective motion states; applying a Non-uniform Fast Fourier Transform (NUFFT) to each of the multiple frames of spiral MRI data having respective motion states to generate respective k-space data sets corresponding to each of the multiple frames of spiral MRI data having respective motion states; combining the respective k-space data sets to produce a motion-corrupted k-space data set of spiral MRI data; applying an adjoint NUFFT to the motion-corrupted k-space data set and forming respectively updated frames of motion-corrupted MRI data in the image domain; and using the respectively updated frames of motion corrupted MRI data to train a neural network that generates output frames of motion free MRI data.

In some embodiments, the method includes augmenting the original frames of motion free MRI data to form augmented frames of motion free MRI data in the image domain.

In some embodiments, the augmentation comprises applying in-plane rotations, horizontal flips, and/or vertical flips to the original frames.

In some embodiments, training the neural network comprises training a generative adversarial network with the augmented frames of motion-free MRI data and the respectively updated frames of motion-corrupted MRI data.

In some embodiments, the augmented frames of motion-free MRI data and the respectively updated frames of motion-corrupted MRI data are saved in a computer in the image domain format.

In some embodiments, the method includes training the generative adversarial network by applying the respectively updated frames of motion-corrupted MRI data to a generator in the generative adversarial network to produce respective motion compensated images accessible by a discriminator in the generative adversarial network.

In some embodiments, the method includes training the generative adversarial network by applying the respectively updated frames of motion-corrupted MRI data and the respective motion compensated images to a discriminator within the generative adversarial network.

In some embodiments, the method includes training the generative adversarial network by applying the respectively updated frames of motion-corrupted MRI data and a target motion-free image to a discriminator within the generative adversarial network.

In some embodiments, the generative adversarial network is trained to minimize error functions.

In another aspect, the present disclosure relates to a computer implemented method of training a neural network to correct motion-induced errors in magnetic resonance images. In one embodiment, the method includes acquiring original frames of motion-free magnetic resonance image (MRI) data of a target object; for each original frame of motion-free MRI data, selecting spiral interleaves for spatial transformation and applying a respective spatial transformation matrix to the selected spiral interleaves therein to produce multiple frames of spiral MRI data having respective motion states; applying a Non-uniform Fast Fourier Transform (NUFFT) to each of the multiple frames of spiral MRI data having respective motion states to generate respective k-space data sets corresponding to each of the multiple frames of spiral MRI data having respective motion states; combining the respective k-space data sets to produce a motion-corrupted k-space data set of spiral MRI data; applying an adjoint NUFFT to the motion-corrupted k-space data set and forming respectively updated frames of motion-corrupted MRI data in the image domain; and using the respectively updated frames of motion corrupted MRI data to train a neural network that generates output frames of motion free MRI data.

In some embodiments, the method includes applying the spatial transformation comprises simulating in plane rigid motion artifacts from the original frames to produce the multiple frames of spiral MRI data having respective motion states.

In some embodiments, the method includes selecting spiral interleaves for spatial transformation comprises dividing all spiral interleaves within the original frames into a selected number of sets, wherein each set is subject to a respective motion event corresponding to a respective spatial transformation matrix.

In some embodiments, the number of spiral interleaves in a set is randomly selected from {8, 16, 32, 64, 128}.

In some embodiments, the spatial transformation of the spiral interleaves comprises a type of spiral trajectory randomly selected from constant density, variable density, and dual density transformations.

In some embodiments, forming the multiple frames of spiral MRI data having respective motion states further comprises applying in-plane horizontal and vertical translations and/or in plane rotations to the original frames of motion free MRI data.

Other aspects and features according to the example embodiments of the present disclosure will become apparent to those of ordinary skill in the art, upon reviewing the following detailed description in conjunction with the accompanying figures.

BRIEF DESCRIPTION OF THE DRAWINGS

Reference will now be made to the accompanying drawings, which are not necessarily drawn to scale.

FIG. 3A illustrates a method of training a neural network to correct motion-induced artifacts in spirally sampled magnetic resonance images, comprising; FIG. 3B illustrates a method of training a neural network to correct motion-induced errors in spirally sampled magnetic resonance images.

FIG. 7 illustrates a quantitative evaluation of network performance for an example embodiment of the present disclosure.

FIG. 11 illustrates a table of quantitative evaluation results according to an example embodiment of the present disclosure.

FIGS. 12A-12C illustrate methods according to example embodiments of the present disclosure. FIG. 12A illustrates a method of simulating motion artifacts for one slice of an MRI image to create a motion corrupted image. FIG. 12B illustrates a motion compensation network architecture with a U-Net generator and a three-layer discriminator where the input to the generator is a motion corrupted image (e.g., the motion corrupted image of FIG. 12A). FIG. 12C illustrates example parameters that can be use din motion simulation and training augmentation.

FIGS. 14A-14B illustrate results of an experiment performed using an example embodiment of the present disclosure. FIG. 14A illustrates representative motion compensation results from a simulated motion testing dataset including NRMSE, PSNR and SSIM between the motion-free image and the motion-corrupted or motion-compensated image. FIG. 14B illustrates quantitative evaluation results from the same set of results that FIG. 14A was selected from.

FIG. 15A illustrates the results of motion compensation for motion corrupted images with different amounts of maximum displacement. FIG. 15B illustrates quantitative results of motion compensation including the average NRMSE, PSNR and SSIM of the motion-compensated images in the example embodiment of the present disclosure.

FIG. 18 illustrates a description of motion simulation parameters according to an example embodiment of the present disclosure.

DETAILED DESCRIPTION

Figure 1:
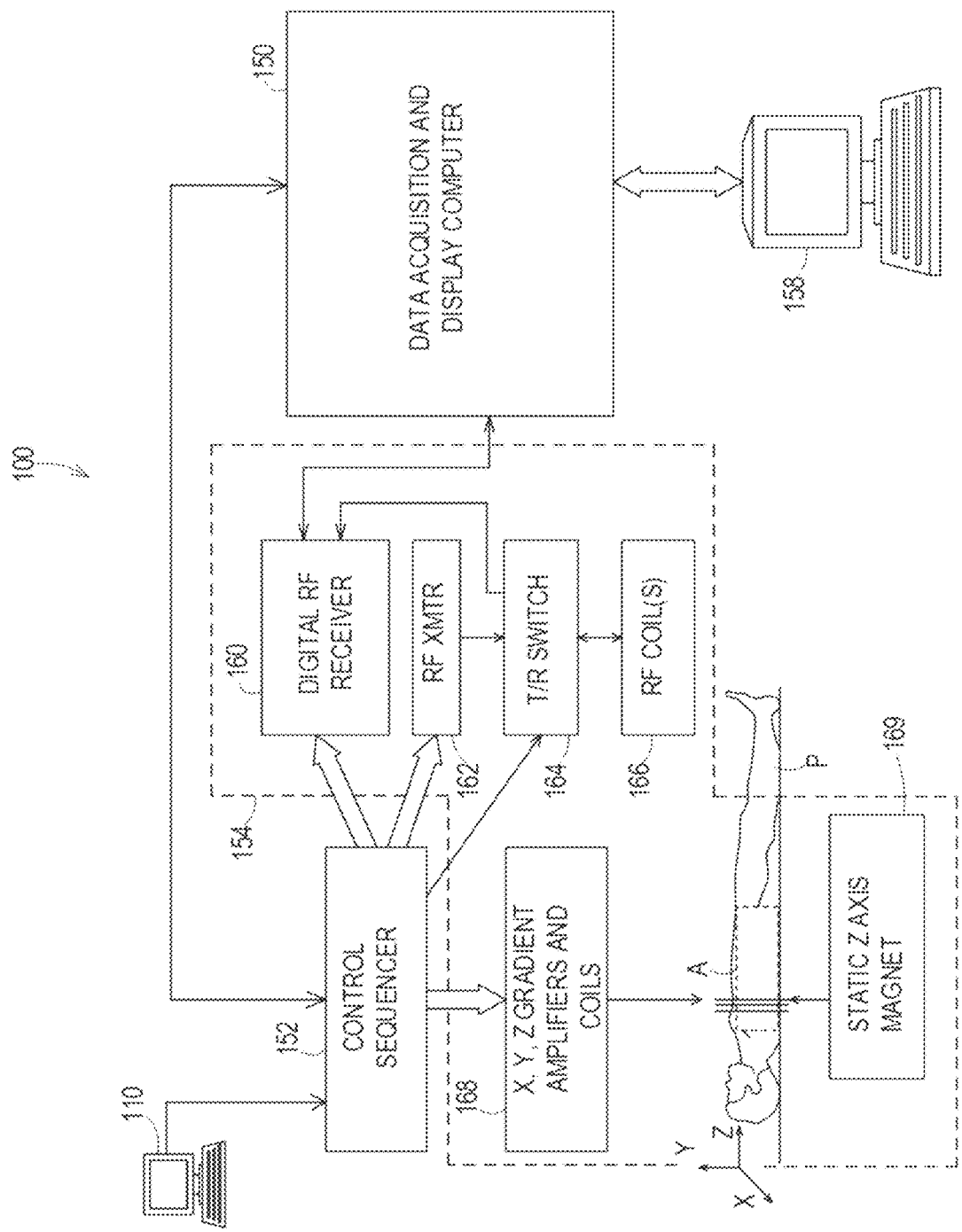
FIG. 1 is a system diagram illustrating an operating environment capable of implementing aspects of the present disclosure.

Although example embodiments of the present disclosure are explained in detail herein, it is to be understood that other embodiments are contemplated. Accordingly, it is not intended that the present disclosure be limited in its scope to the details of construction and arrangement of components set forth in the following description or illustrated in the drawings. The present disclosure is capable of other embodiments and of being practiced or carried out in various ways.

It must also be noted that, as used in the specification and the appended claims, the singular forms "a," "an" and "the" include plural referents unless the context clearly dictates otherwise. Ranges may be expressed herein as from "about" or "approximately" one particular value and/or to "about" or "approximately" another particular value. When such a range is expressed, other exemplary embodiments include from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

Other terms are not intended to imply an unrealistic scope but are meant to be understood in relation to practicalities. For example, references to "motion-free images" may not be entirely free of all motion artifacts but instead are evaluated as high quality images and meet the standards necessary for the task at hand. Thresholding may be used to determine what is considered to be a motion free image. Other terms in this disclosure may be terms of art that are defined in the different articles and publications listed at the end of this disclosure and incorporated by reference into this disclosure.

In describing example embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the present disclosure. Similarly, it is also to be understood that the mention of one or more components in a device or system does not preclude the presence of additional components or intervening components between those components expressly identified.

As discussed herein, a "subject" (or "patient") may be any applicable human, animal, or other organism, living or dead, or other biological or molecular structure or chemical environment, and may relate to particular components of the subject, for instance specific organs, tissues, or fluids of a subject, may be in a particular location of the subject, referred to herein as an "area of interest" or a "region of interest."

Some references, which may include various patents, patent applications, and publications, are cited in reference lists and discussed in the disclosure provided herein. The citation and/or discussion of such references is provided merely to clarify the description of the present disclosure and is not an admission that any such reference is "prior art" to any aspects of the present disclosure described herein. In terms of notation, "[n]" corresponds to the $n^{th}$ reference in the list. For example, "[1]" refers to the 1st reference in the list, namely Zhang, K., Zuo, W., Chen, Y., Meng, D., Zhang, L.: Beyond a Gaussian Denoiser: Residual Learning of Deep CNN for Image Denoising. IEEE Transactions on Image Processing. 26, 3142-3155 (2017). All references cited and discussed in this specification are incorporated herein by reference in their entireties and to the same extent as if each reference was individually incorporated by reference.

A detailed description of aspects of the present disclosure, in accordance with various example embodiments, will now be provided with reference to the accompanying drawings. The drawings form a part hereof and show, by way of illustration, specific embodiments and examples. In referring to the drawings, like numerals represent like elements throughout the several figures. Some experimental data are presented herein for purposes of illustration and should not be construed as limiting the scope of the present disclosure in any way or excluding any alternative or additional embodiments.

FIG. 1 is a system diagram illustrating an operating environment capable of implementing aspects of the present disclosure in accordance with one or more example embodiments. FIG. 1 illustrates an example of a magnetic resonance imaging (MRI) system 100, including a data acquisition and display computer 150 coupled to an operator console 110, an MRI real-time control sequencer 152, and an MRI subsystem 154. The MRI subsystem 154 may include XYZ magnetic gradient coils and associated amplifiers 168, a static Z-axis magnet 169, a digital RF transmitter 162, a digital RF receiver 160, a transmit/receive switch 164, and RF coil(s) 166. The MRI subsystem 154 may be controlled in real time by control sequencer 152 to generate magnetic and radio frequency fields that stimulate magnetic resonance phenomena in a living subject, patient P, to be imaged. A contrast-enhanced image of an area of interest A of the patient P may be shown on display 158. The display 158 may be implemented through a variety of output interfaces, including a monitor, printer, or data storage.

The area of interest "A" corresponds to a region associated with one or more physiological activities in patient "P". The area of interest shown in the example embodiment of FIG. 1 corresponds to a chest region of patient "P", but the area of interest for purposes of implementing aspects of the disclosure presented herein is not limited to the chest area. It should be recognized and appreciated that the area of interest can be one or more of a brain region, heart region, and upper or lower limb regions of the patient "P", for example.

It should be appreciated that any number and type of computer-based medical imaging systems or components, including various types of commercially available medical imaging systems and components, may be used to practice certain aspects of the present disclosure. Systems as described herein with respect to example embodiments are not intended to be specifically limited to magnetic resonance imaging (MRI) implementations or the particular system shown in FIG. 1.

One or more data acquisition or data collection steps as described herein in accordance with one or more embodiments may include acquiring, collecting, receiving, or otherwise obtaining data such as imaging data corresponding to an area of interest. By way of example, data acquisition or collection may include acquiring data via a data acquisition device, receiving data from an on-site or off-site data acquisition device or from another data collection, storage, or processing device. Similarly, data acquisition or data collection devices of a system in accordance with one or more embodiments of the present disclosure may include any device configured to acquire, collect, or otherwise obtain data, or to receive data from a data acquisition device within the system, an independent data acquisition device located on-site or off-site, or another data collection, storage, or processing device.

Figure 2:
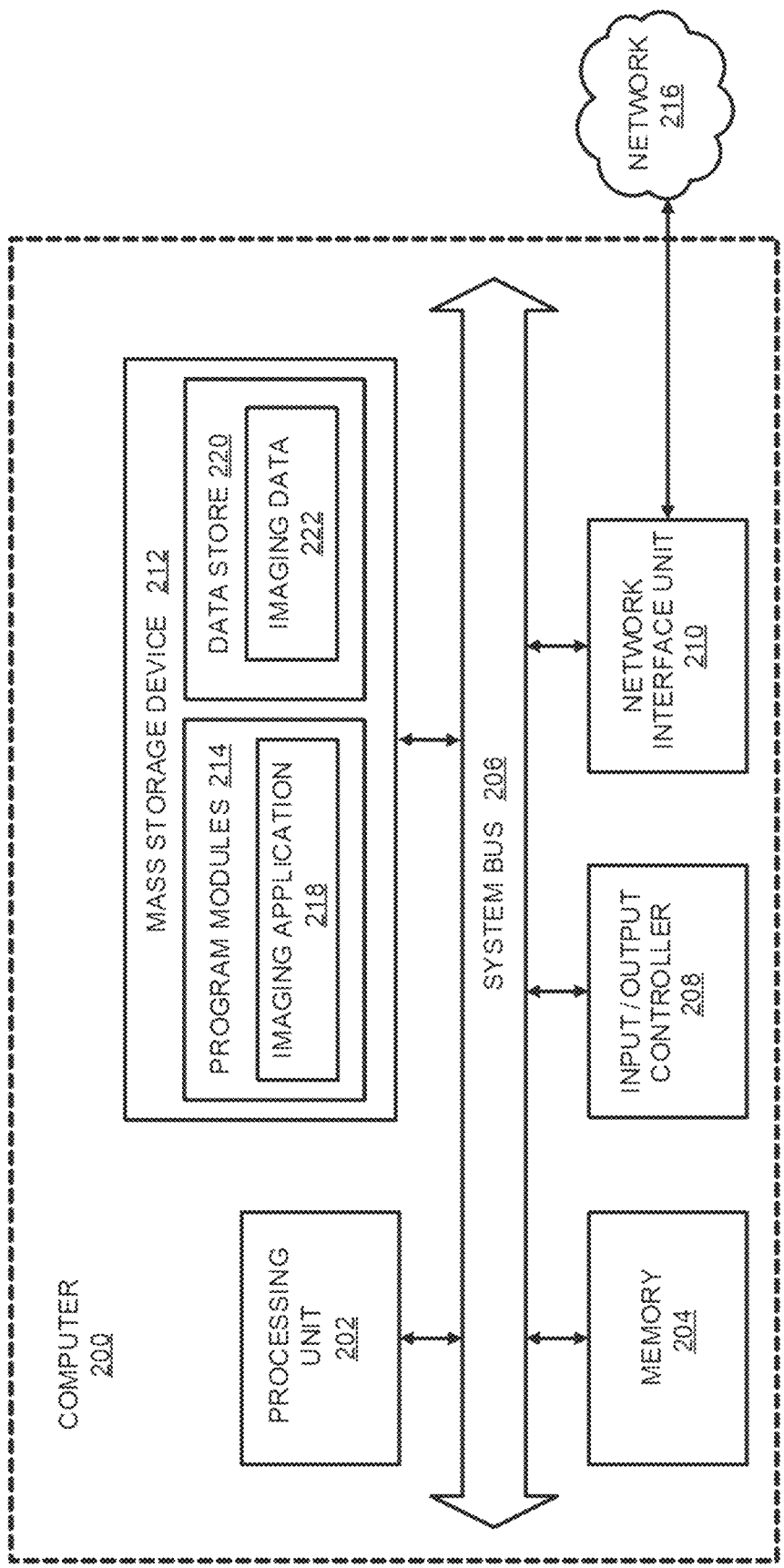
FIG. 2 is a computer architecture diagram showing a general computing system capable of implementing aspects of the present disclosure.

FIG. 2 is a computer architecture diagram showing a general computing system capable of implementing aspects of the present disclosure in accordance with one or more embodiments described herein. A computer 200 may be configured to perform one or more functions associated with embodiments of this disclosure. For example, the computer 200 may be configured to perform operations for denoising MR images as described herein with respect to certain embodiments. It should be appreciated that the computer 200 may be implemented within a single computing device or a computing system formed with multiple connected computing devices. The computer 200 may be configured to perform various distributed computing tasks, which may distribute processing and/or storage resources among the multiple devices. The data acquisition and display computer 150 and/or operator console 110 of the system shown in FIG. 1 may include one or more systems and components of the computer 200.

As shown, the computer 200 includes a processing unit 202 ("CPU"), a system memory 204, and a system bus 206 that couples the memory 204 to the CPU 202. The computer 200 further includes a mass storage device 212 for storing program modules 214. The program modules 214 may be operable to perform one or more functions associated with embodiments of method as illustrated in one or more of the figures of this disclosure, for example to cause the computer 200 to perform operations of the present disclosure as described below. The program modules 214 may include an imaging application 218 for performing data acquisition functions as described herein, for example to receive image data corresponding to magnetic resonance imaging of an area of interest. The computer 200 can include a data store 220 for storing data that may include imaging-related data 222 such as acquired image data, and a modeling data store 224 for storing image modeling data, or other various types of data utilized in practicing aspects of the present disclosure.

The mass storage device 212 is connected to the CPU 202 through a mass storage controller (not shown) connected to the bus 206. The mass storage device 212 and its associated computer-storage media provide non-volatile storage for the computer 200. Although the description of computer-storage media contained herein refers to a mass storage device, such as a hard disk or CD-ROM drive, it should be appreciated by those skilled in the art that computer-storage media can be any available computer storage media that can be accessed by the computer 200.

By way of example, and not limitation, computer-storage media (also referred to herein as a "computer-readable storage medium" or "computer-readable storage media") may include volatile and non-volatile, removable and non-removable media implemented in any method or technology for storage of information such as computer-storage instructions, data structures, program modules, or other data. For example, computer storage media includes, but is not limited to, RAM, ROM, EPROM, EEPROM, flash memory or other solid state memory technology, CD-ROM, digital versatile disks ("DVD"), HD-DVD, BLU-RAY, or other optical storage, magnetic cassettes, magnetic tape, magnetic disk storage or other magnetic storage devices, or any other medium which can be used to store the desired information and which can be accessed by the computer 200. Transitory signals are not "computer-storage media", "computer-readable storage medium" or "computer-readable storage media" as described herein.

According to various embodiments, the computer 200 may operate in a networked environment using connections to other local or remote computers through a network 216 via a network interface unit 210 connected to the bus 206. The network interface unit 210 may facilitate connection of the computing device inputs and outputs to one or more suitable networks and/or connections such as a local area network (LAN), a wide area network (WAN), the Internet, a cellular network, a radio frequency network, a Bluetooth-enabled network, a Wi-Fi enabled network, a satellite-based network, or other wired and/or wireless networks for communication with external devices and/or systems. The computer 200 may also include an input/output controller 208 for receiving and processing input from a number of input devices. Input devices may include one or more of keyboards, mice, stylus, touchscreens, microphones, audio capturing devices, or image/video capturing devices. An end user may utilize such input devices to interact with a user interface, for example a graphical user interface, for managing various functions performed by the computer 200.

The bus 206 may enable the processing unit 202 to read code and/or data to/from the mass storage device 212 or other computer-storage media. The computer-storage media may represent apparatus in the form of storage elements that are implemented using any suitable technology, including but not limited to semiconductors, magnetic materials, optics, or the like. The computer-storage media may represent memory components, whether characterized as RAM, ROM, flash, or other types of technology. The computer-storage media may also represent secondary storage, whether implemented as hard drives or otherwise. Hard drive implementations may be characterized as solid state or may include rotating media storing magnetically-encoded information. The program modules 214, which include the imaging application 218, may include instructions that, when loaded into the processing unit 202 and executed, cause the computer 200 to provide functions associated with embodiments illustrated herein. The program modules 214 may also provide various tools or techniques by which the computer 200 may participate within the overall systems or operating environments using the components, flows, and data structures discussed throughout this description.

In general, the program modules 214 may, when loaded into the processing unit 202 and executed, transform the processing unit 202 and the overall computer 200 from a general-purpose computing system into a special-purpose computing system. The processing unit 202 may be constructed from any number of transistors or other discrete circuit elements, which may individually or collectively assume any number of states. More specifically, the processing unit 202 may operate as a finite-state machine, in response to executable instructions contained within the program modules 214. These computer-executable instructions may transform the processing unit 202 by specifying how the processing unit 202 transitions between states, thereby transforming the transistors or other discrete hardware elements constituting the processing unit 202.

Encoding the program modules 214 may also transform the physical structure of the computer-storage media. The specific transformation of physical structure may depend on various factors, in different implementations of this description. Examples of such factors may include but are not limited to the technology used to implement the computer-storage media, whether the computer storage media are characterized as primary or secondary storage, and the like. For example, if the computer-storage media are implemented as semiconductor-based memory, the program modules 214 may transform the physical state of the semiconductor memory, when the software is encoded therein. For example, the program modules 214 may transform the state of transistors, capacitors, or other discrete circuit elements constituting the semiconductor memory.

As another example, the computer-storage media may be implemented using magnetic or optical technology. In such implementations, the program modules 214 may transform the physical state of magnetic or optical media, when the software is encoded therein. These transformations may include altering the magnetic characteristics of particular locations within given magnetic media. These transformations may also include altering the physical features or characteristics of particular locations within given optical media, to change the optical characteristics of those locations. Other transformations of physical media are possible without departing from the scope of the present description, with the foregoing examples provided only to facilitate this discussion.

Commercially available medical imaging systems and components, may be used to practice certain aspects of the present disclosure. These commercially available imaging systems can include 1.5 T and 3 T MRI scanners. Some scanners operation at field strengths that are higher or lower than these and still fall within the scope of this disclosure.

Figure 3A:
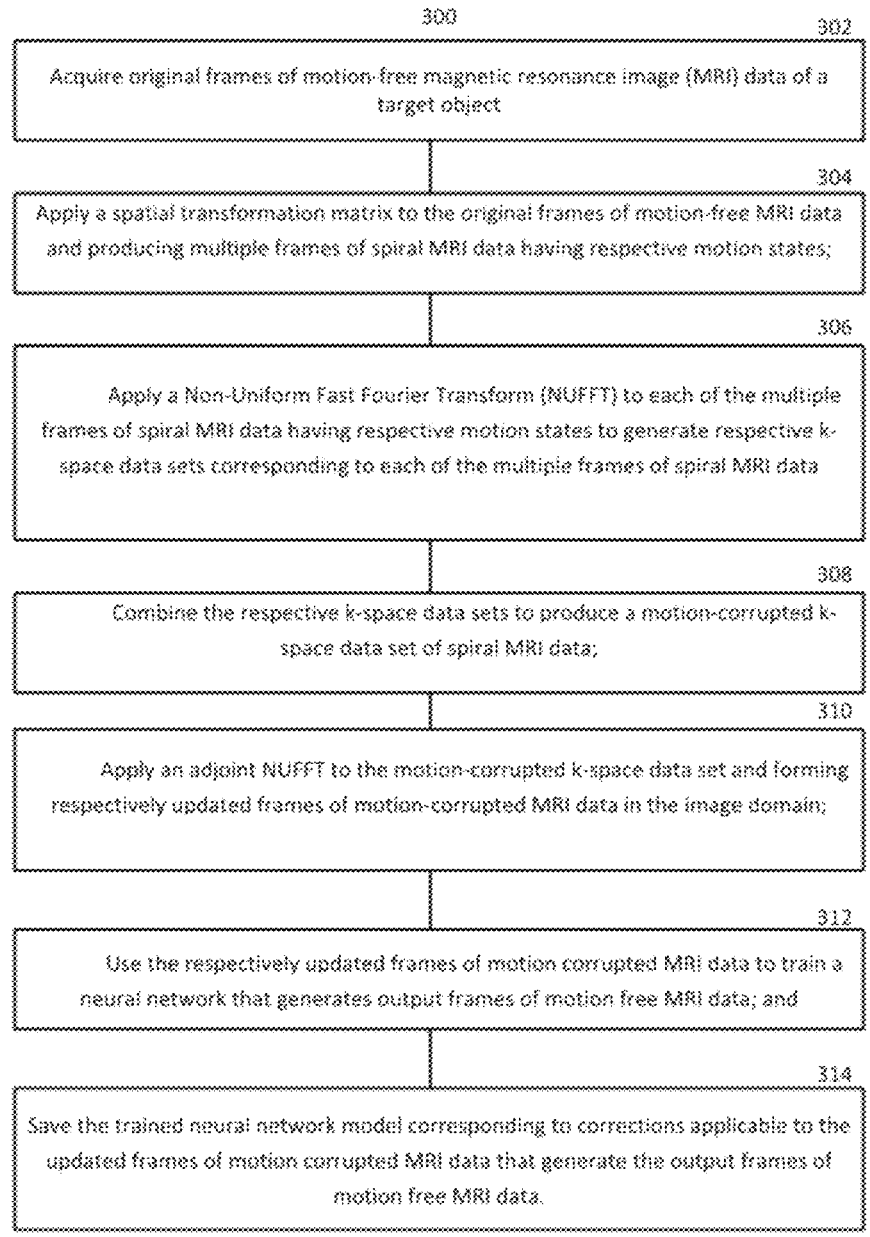
FIGS. 3A-3B illustrate methods of performing motion compensation on MRI images, according to embodiments of the present disclosure.

With reference to FIG. 3A, a method 300 for training a neural network to correct motion-induced artifacts in magnetic resonance images is shown.

At step 302, the method can include acquiring original spirally-sampled frames of motion-free magnetic resonance image (MRI) data of a target object. The images can be images that were acquired using any method, including using both conventional MRI sampling and spiral MIR sampling.

In some embodiments of the present disclosure, the method 300 can also include augmenting the original frames of motion free MRI data to form augmented frames of motion free MRI data in the image domain. The augmentation can include applying different transforms to the original frames. Non-limiting examples of transforms that can be applied in embodiments of the present disclosure include applying in-plane rotations, horizontal flips, and/or vertical flips to the original frames. In some embodiments of the present disclosure, the augmented frames of motion-free MRI data and the respectively updated frames of motion-corrupted MRI data can be saved in a computer. As a non-limiting example, the augmented frames and the respectively updated frames can be saved in the image domain format.

At step 304, a spatial transformation matrix can be applied to the original frames of the motion-free MRI data to produce multiple frames of spiral MRI data having respective motion states.

At step 306, a non-uniform Fast Fourier Transform (NUFFT) can be applied to each of the multiple frames of spiral MRI data having respective motion states to generate respective k-space data sets corresponding to each of the multiple frames of spiral MRI data having respective motion states.

At step 308, the respective k-space data sets can be combined. The combination of the respective K-space datasets can produce a motion-corrupted k-space data set of spiral MRI data.

At step 310, an adjointNUFFT can be applied to the motion-corrupted k-space data set and respectively updated frames of motion-corrupted MRI data in the image domain can be formed.

At step 312, a neural network can be trained that generates output frames of motion free MRI data using the respectively updated frames of motion corrupted MRI data. In some embodiments of the present disclosure, step 312 can include training a generative adversarial network with augmented frames of motion-free MRI data and the respectively updated frames of motion-corrupted MRI data. As a non-limiting example, training the generative adversarial network can include applying the respectively updated frames of motion-corrupted MRI data to a generator in the generative adversarial network to produce respective motion compensated images accessible by a discriminator in the generative adversarial network. In some embodiments of the present disclosure, training the generative adversarial network can also include applying the respectively updated frames of motion-corrupted MRI data and the respective motion compensated images to a discriminator within the generative adversarial network.

In some embodiments of the present disclosure, the generative adversarial network can be trained by applying the respectively updated frames of motion-corrupted MRI data and a target motion-free image to a discriminator within the generative adversarial network. The generative adversarial network that can be trained in step 312 can also be trained to minimize or maximize a function, for example a function related to image quality. As a non-limiting example the function can be an error function and the system can be configured to minimize the error function. A non-limiting example of an error function is a function that represents the amount of error in the output images.

At step 314, the trained neural network model can be saved. The trained neural network model can correspond to corrections applicable to the updated frames of motion corrupted MRI data that generate the output frames of motion-free MRI data.

Figure 3B:
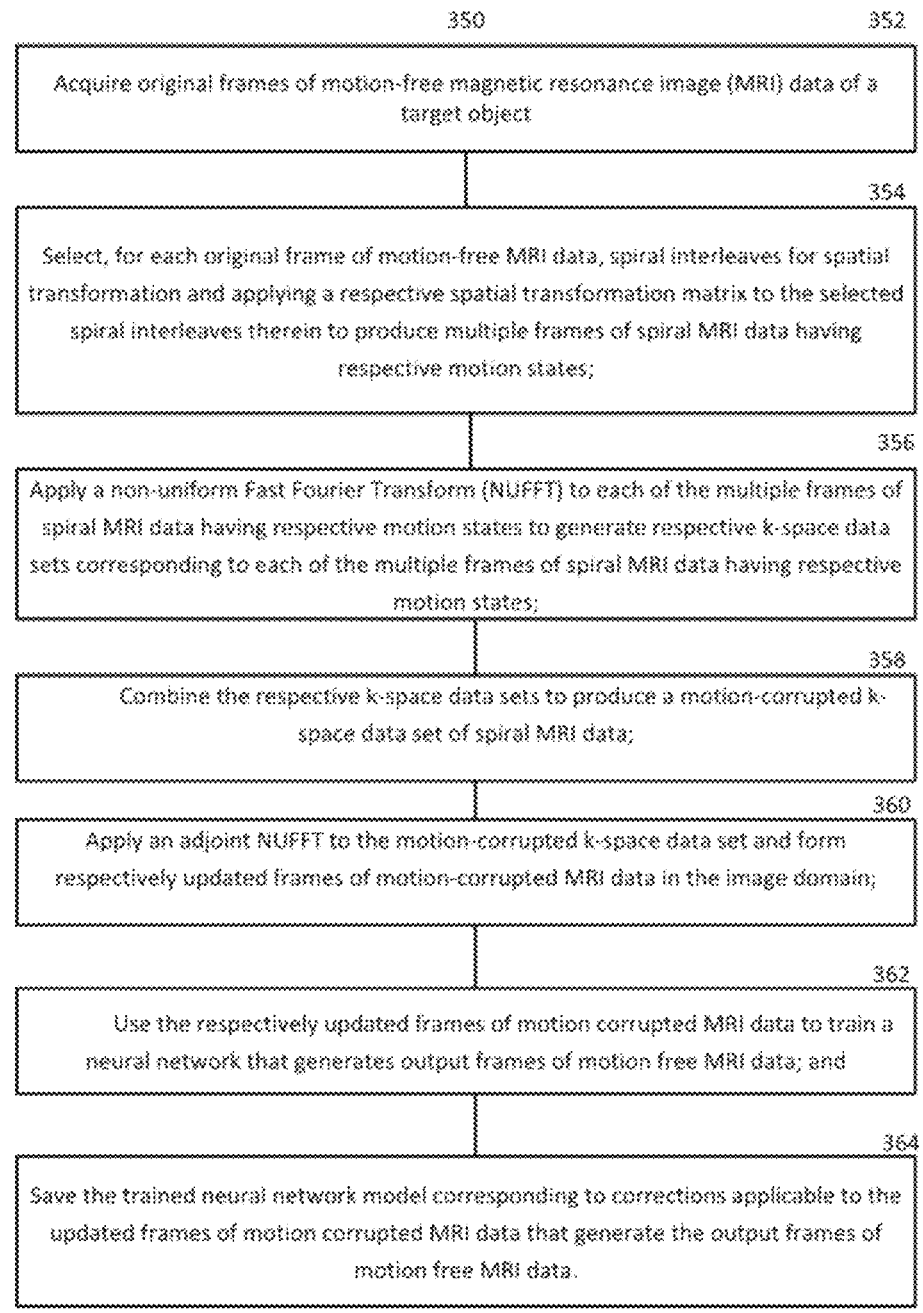

FIG. 3B illustrates another method 350 according to an embodiment of the present disclosure. The method 350 can train a neural network to correct motion-induced errors in magnetic resonance images.

At step 352 original frames of motion-free magnetic resonance image (MRI) data of a target object can be acquired.

At step 354, spiral interleaves for spatial transformation can be selected for each original frame of motion-free MRI data, and a respective spatial transformation matrix is applied to the selected spiral interleaves therein to produce multiple frames of spiral MRI data having respective motion states.

In some embodiments of the present disclosure, step 354 can include selecting spiral interleaves for spatial transformation by dividing all spiral interleaves within the original frames into a selected number of sets, wherein each set is subject to a respective motion event corresponding to a respective spatial transformation matrix.

In some embodiments of the present disclosure, applying the spatial transformation can include simulating in plane rigid motion artifacts from the original frames to produce multiple frames of spiral MRI data having respective motion states.

In some embodiments of the present disclosure, the number of spiral interleaves in a set can randomly selected from {8, 16, 32, 64, 128}. Additionally, in some embodiments, the spatial transformation of the spiral interleaves can include a type of spiral trajectory randomly selected from constant density, variable density, and dual density transformations.

At step 356, a Non-uniform Fast Fourier Transform (NUFFT) can be applied to each of the multiple frames of spiral MRI data having respective motion states to generate respective k-space data sets corresponding to each of the multiple frames of spiral MRI data having respective motion states;

At step 358, the respective k-space data sets are combined to produce a motion-corrupted k-space data set of spiral MRI data.

At step 360, an adjointNUFFT can be applied to the motion-corrupted k-space data set and respectively updated frames are formed of motion-corrupted MRI data in the image domain. In some embodiments of the present disclosure, forming the multiple frames of spiral MRI data having respective motion states can include applying in-plane horizontal and vertical translations and/or in plane rotations to the original frames of motion free MRI data.

At step 362, a neural network can be trained that generates output frames of motion free MRI data using the respectively updated frames of motion corrupted MRI data that generate the output frames of motion free MRI data. At step 364, data can be saved corresponding to corrections applicable to the updated frames of motion corrupted MRI data to generate the output frames of motion free MRI data Example 1: Deep Convolutional Neural Network An example embodiment of the present disclosure can include a deep convolutional neural network (DCNN). The example embodiment can be configured to correct motion corrupted brain images. This can be beneficial because movement of the subject during MRI acquisition can cause image quality degradation.

An example embodiment of the present disclosure was configured. To get paired training datasets, synthetic motion artifacts can be added by simulating k-space data along different sampling trajectories. Quantitative evaluation showed that the CNN significantly improved the image quality. In the example embodiment, spiral trajectory performed better than the Cartesian trajectory both before and after the motion deblurring. A network trained with an L1 loss function achieved better RMSE and SSIM than one trained with an L2 loss function after convergence. The example embodiment of the present disclosure including deep learning yielded rapid and flexible motion compensation.

During MRI acquisition, subject motion can severely degrade the resulting images by introducing ghosting and blurring. Spiral sampling can be motion insensitive compared with Cartesian sampling because of its high data acquisition efficiency and oversampling of the k-space center.

Figure 4:
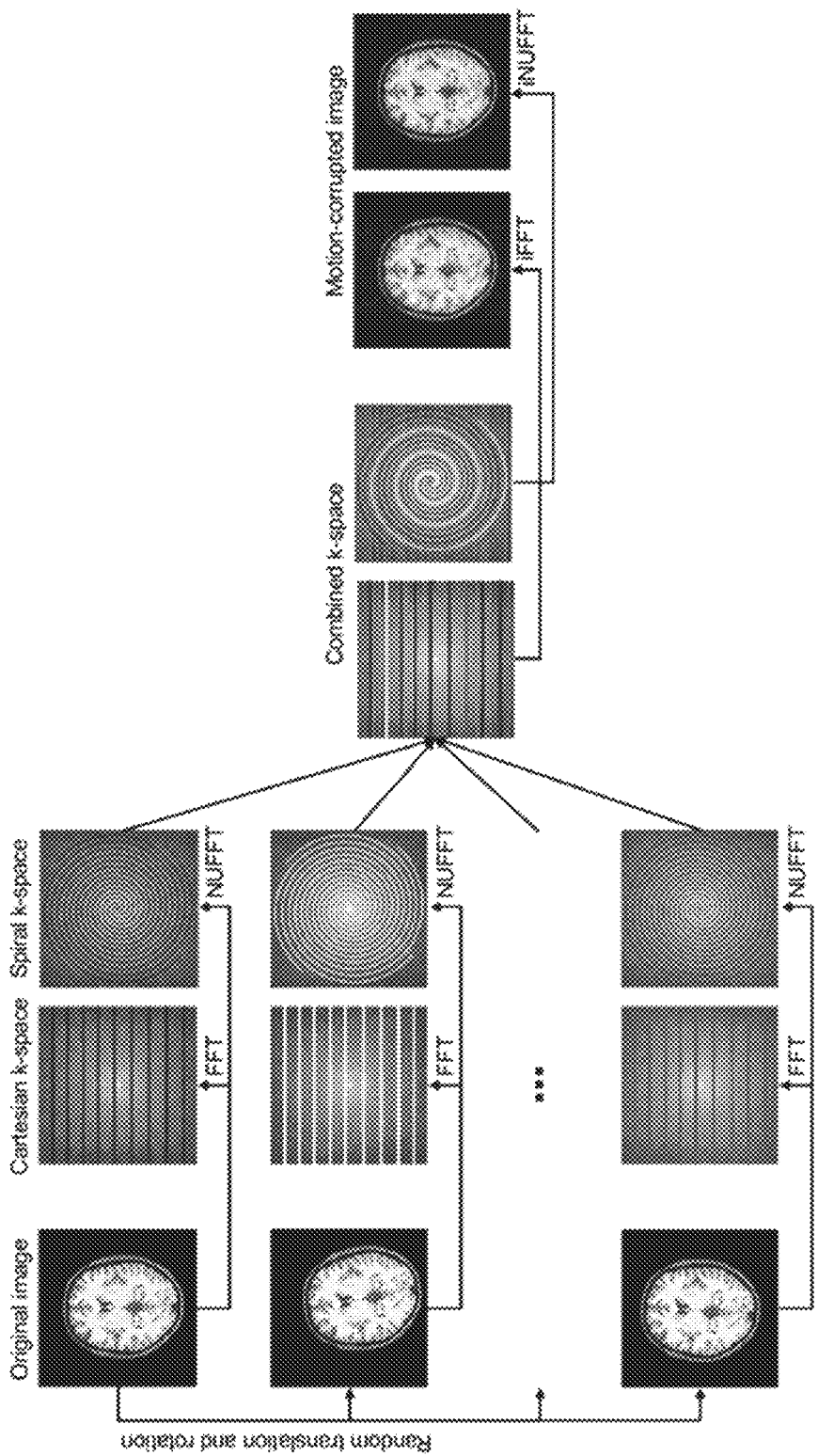
FIG. 4 illustrates a method for simulating motion in images, according to an example embodiment of the present disclosure.

To test the example embodiment of the present disclosure, brain images were obtained from an open database, which includes T1 weighted FLASH magnitude images for 88 subjects, acquired at 1×1×1 mm^3. [2] Each subject's image contains 160 or 176 axial slices. 4362 slices were randomly selected as the training data, and the remaining 1364 slices were selected as the test data. Preprocessing included padding each image to 256×256 and intensity normalization. To simulate motion artifacts, both the original images and translated and rotated images were first transformed into Cartesian k-space by a fast Fourier transform (FFT) or into spiral k-space by a nonuniform FFT (NUFFT) [3]. Then specific phase-encoding lines or spiral interleaves in the original k-space were replaced with the corresponding lines or interleaves from the transformed images. The final motion-corrupted images were reconstructed from the "combined" k-space by inverse FFT or inverse NUFFT [4], as shown in FIG. 4. The same percentage of phase-encoding lines or spiral interleaves were corrupted to ensure that the motion artifacts were comparable for different trajectories. It should be understood that the examples of axial slice counts, interleaves, distances, and other details given about the dataset are intended only as non-limiting examples and that embodiments of the present disclosure can perform motion compensation using different input values.

Figure 5:
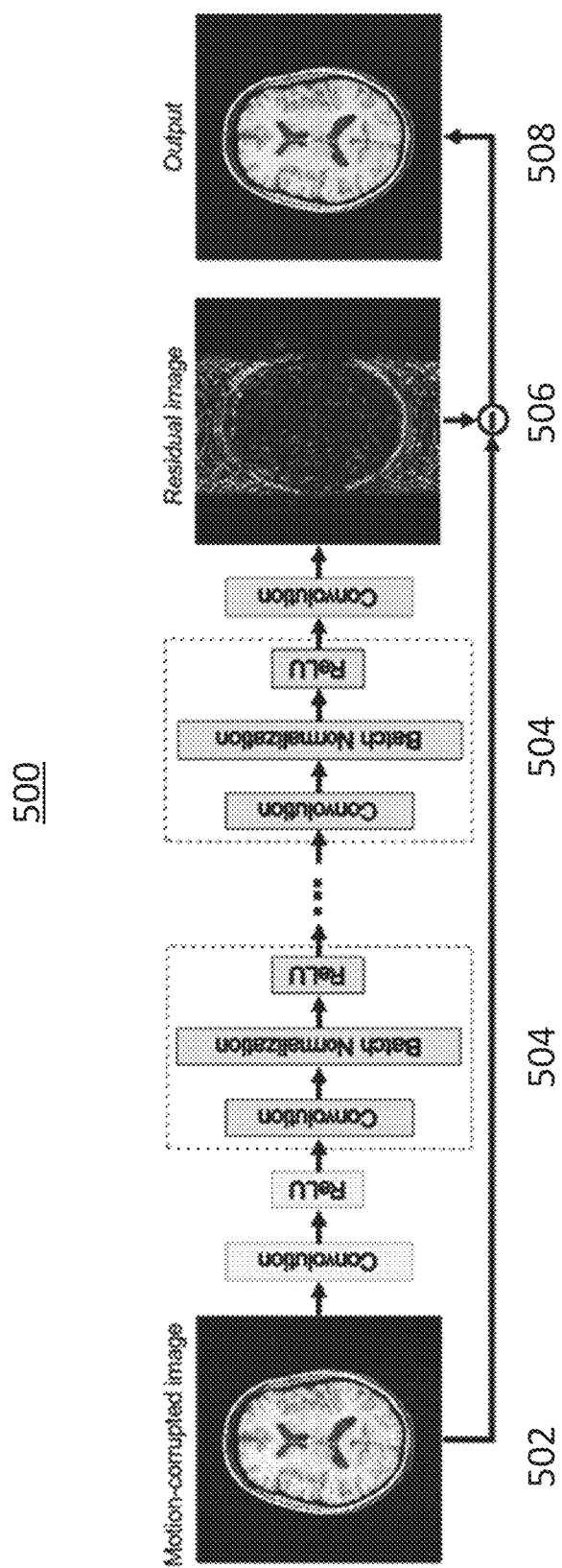
FIG. 5 illustrates a deep convolutional neural network (DCNN) architecture for motion correct, according to an example embodiment of the present disclosure.

FIG. 5 shows a network architecture 500 for an example embodiment of the present disclosure. In the example embodiment, deep CNN was implemented using TensorFlow [1]. The input 502 of the network can be the magnitude-only motion-corrupted image. After several convolution layers 504 with batch normalization and ReLU, a residual image 506 can be predicted and the output 508 of the network is produced by subtracting the residual image from the input. The network can be trained for Cartesian and spiral trajectories separately. The parameters can be optimized using the Adam [5] optimizer with L1 loss function and learning rate 0.001. The example embodiment implemented the L2 loss function with learning rate 0.0001 to compare the performance.

Figure 6:
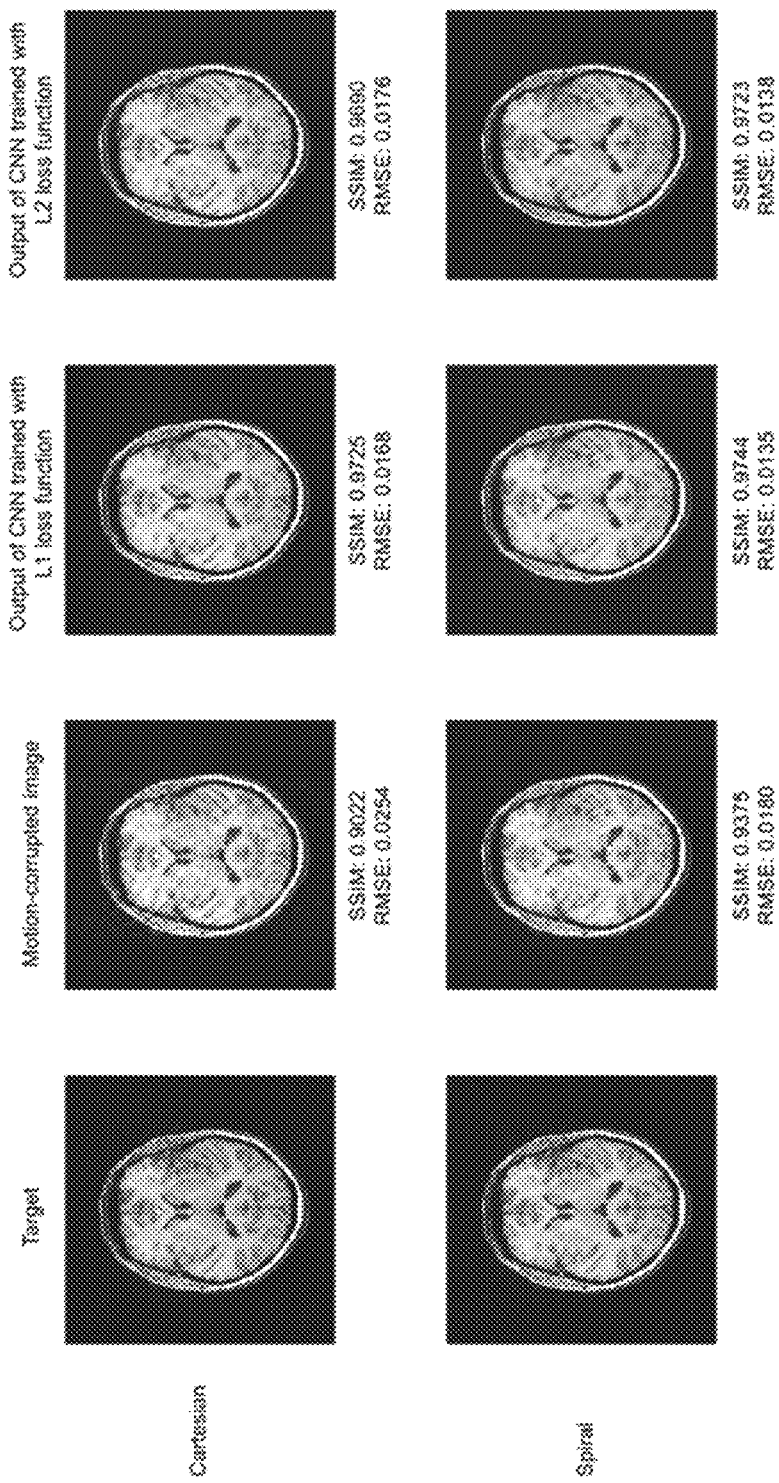
FIG. 6 illustrates an example of motion corrupted images and network outputs according to an example embodiment of the present disclosure.

A representative example of motion-corrupted image and network output for an example embodiment of the present disclosure are shown in FIG. 6. As the root mean squared error (RMSE) of output images decreased and the structural similarity index (SSIM) increased, the network successfully improved the image quality for both Cartesian and spiral sampling patterns. FIG. 7 provides the evaluating results of network performance on the whole test dataset for the non-limiting example embodiment. As spiral k-space sampling can have the advantage of motion insensitivity, the quality of motion-corrupted images with spiral trajectory was higher than that with Cartesian trajectory. After motion compensation, the performance of the network with the spiral trajectory was still better than with the Cartesian trajectory. The CNN trained with L1 loss function reached lower RMSE than that trained with L2 loss function, indicating that that L2 loss can incur more from local minimums in some embodiments of the present disclosure. [6] In a few cases, the outputs of network were degraded compared with the inputs.

By training on brain images with simulated motion, an image domain motion correction CNN was developed. This example embodiment shows that a deep learning based method can remove motion artifacts for both spiral and Cartesian MR images. Spiral can outperform Cartesian in motion robustness both before and after motion correction. Training the network with non-rigid motion data and testing it on real motion data can be performed to evaluate the model's performance and robustness. In addition, phase information can be incorporated into the network and the use of different spiral trajectory designs can be performed.

Example 2: DCNN with U-Net

An example embodiment of the present disclosure can include a deep convolutional neural network (DCNN) and a U-Net. During MRI acquisition, subject motion can severely degrade the resulting images by introducing ghosting and blurring. Spiral sampling can be motion insensitive compared with Cartesian sampling because of its high data acquisition efficiency and oversampling of the k-space center. Deep learning techniques can efficiently address motion for Cartesian trajectories [1A]. Deep convolution neural networks (DCNNs) can correct motion artifacts in the image domain and compare the performance of the method using Cartesian and spiral trajectories.

Figure 8:
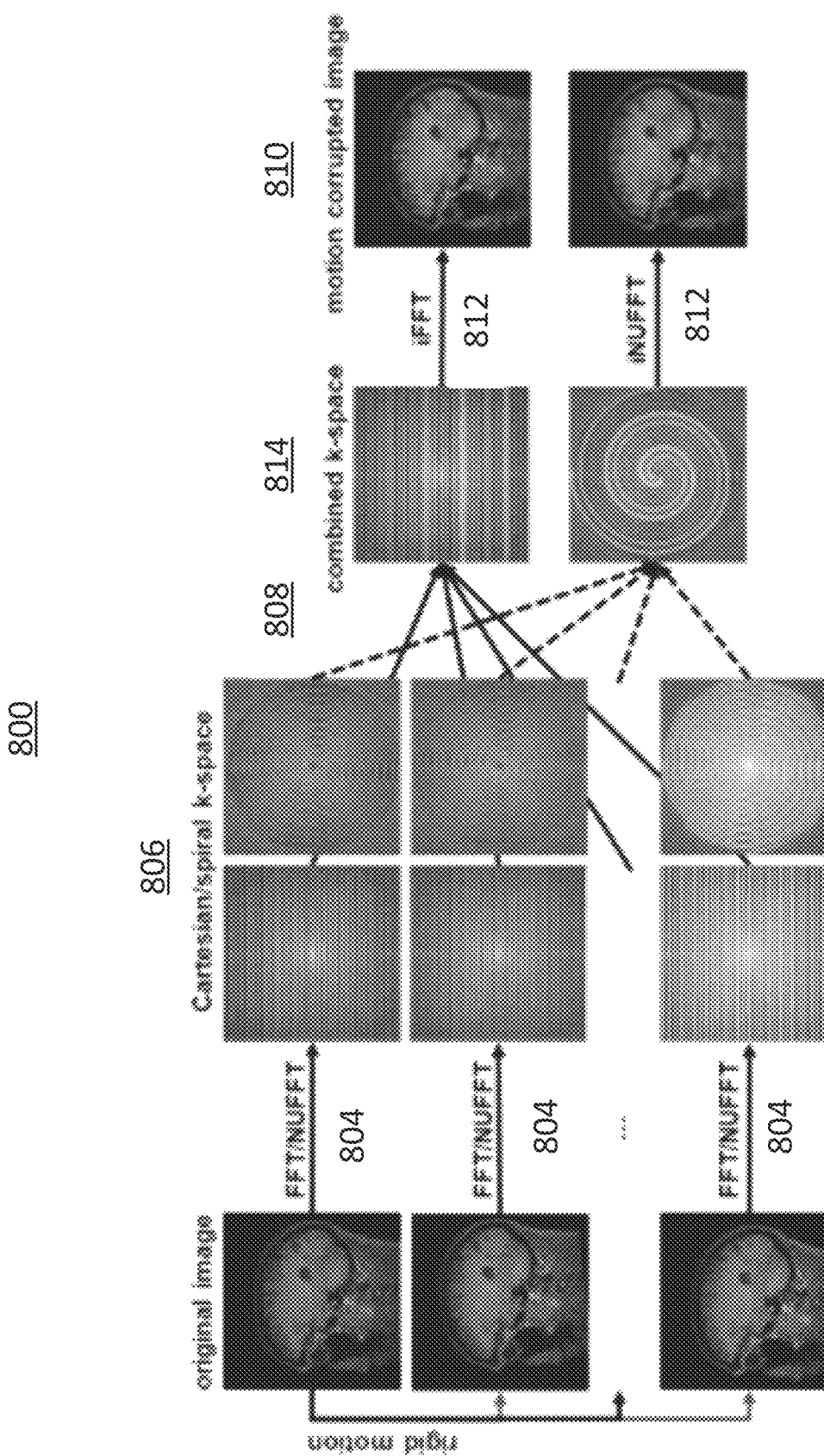
FIG. 8 illustrates a method for simulating motion in images, according to an example embodiment of the present disclosure.

FIG. 8 illustrates another example embodiment of the present disclosure. An open database (http://www.brain-development.org) containing T1 weighted brain images for 580 subjects was used in an example embodiment of the present disclosure. 580 subjects were divided such that 464 subjects (37120 slices) were used for training, and the remaining 116 subjects (9280 slices) were used for testing. Uniform density spiral (UDspiral), variable density spiral (VDspiral) and dual density spiral (DDspiral) trajectories were generated based on the field of view (FOV) and resolution of the image. These images were used as an input 802 to the example embodiment of the present disclosure. To simulate motion artifacts, both the original images and translated and rotated images were first transformed 804 into Cartesian k-space by a fast Fourier transform (FFT) or into spiral k-space 806 by a nonuniform FFT (NUFFT) [2A]. Then specific phase-encoding lines or spiral interleaves in the original k-space were replaced 808 with the corresponding lines or interleaves from the transformed images. The final motion-corrupted images 810 were reconstructed 812 from the combined k-space 814 by inverse FFT or inverse NUFFT, as shown in FIG. 8. The same percentage of phase-encoding lines or spiral interleaves were corrupted to ensure that the motion artifacts were comparable for different trajectories.

Figure 9:
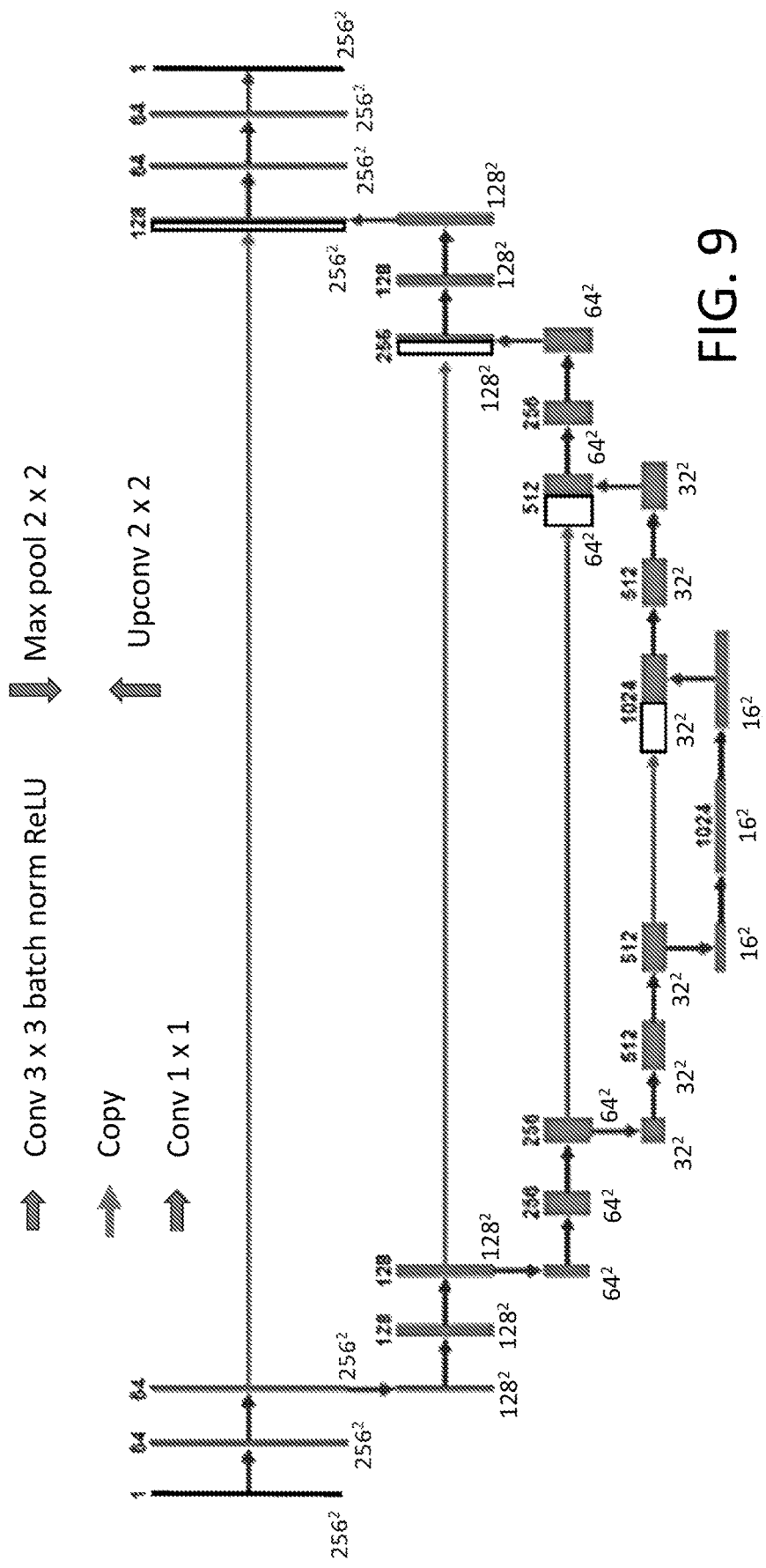
FIG. 9 illustrates a U-Net architecture, according to an example embodiment of the present disclosure.

FIG. 9 shows a non-limiting example of a U-Net architecture [3A] that can be used in embodiments of the present disclosure in this example. After normalizing to range 0 to 1, the magnitude-only motion-corrupted image was passed through the network. The network was trained separately for different trajectories. The parameters were optimized using the Adam [4A] optimizer with L1 loss function [5A] and learning rate 0.001. The structural similarity index (SSIM), peak signal-to-noise ratio (PSNR), root mean square error (RMSE) and absolute difference (ABSD) were calculated as image quality metrics. It should be understood that other U-Net architectures can be used in other embodiments of the present disclosure.

Figure 10:
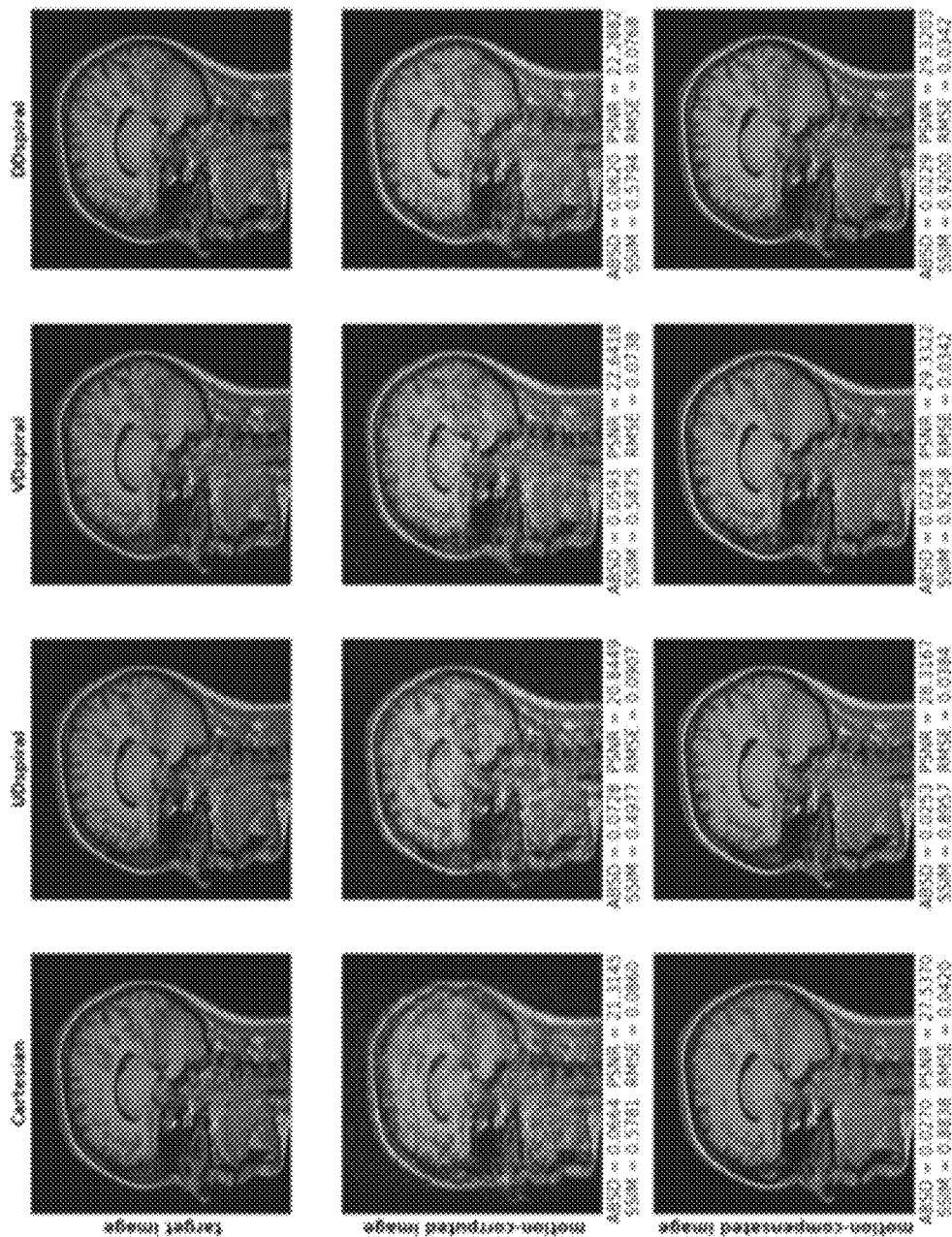
FIG. 10 illustrates sample motion correction results according to an example embodiment of the present disclosure.

Sample correction results from the example embodiment of the present disclosure are shown in FIG. 10. The quantitative evaluation for the testing images is provided in FIG. 11. Paired t-tests were performed to evaluate the difference before and after motion compensation with a significance level of 0.005. Increased SSIM, PSNR and decreased RMSE and ABSD of motion-compensated images indicate that the network successfully improved the image quality for all sampling patterns. One-way ANOVA and Bonferroni post-hoc tests were performed to evaluate the differences among different trajectories after motion compensation. In the non-limiting example embodiment, performance of networks with the VDspiral and DDspiral trajectories were better than with the UDspiral and Cartesian trajectories.

The performance of the non-limiting example embodiment of the present disclosure demonstrates that a deep learning-based method is capable of removing motion artifacts for both Cartesian and spiral MR images. Spiral trajectories, especially VDspiral and DDspiral, can outperform Cartesian trajectories in motion robustness after motion correction.

Example 3: Generative Adversarial Neural Network

Yet another example embodiment of the present disclosure can include a conditional generative adversarial neural network (GAN).

An experiment was performed to validate a retrospective motion compensation technique for spiral brain imaging using a deep convolutional neural network. Various spiral trajectories were generated and in-plane rigid motion artifacts were simulated using an open-source MRI dataset. A conditional generative adversarial network was trained with the motion-free and simulated motion-corrupted image pairs to compensate spiral motion artifacts without knowledge of motion information. The example embodiment was evaluated using both simulated and real motion data. Data with real motion was collected from healthy subjects at 1.5T.

For the simulated motion testing set, after motion compensation, the average normalized root-mean-square error decreased from 0.3439 to 0.2050, and the average peak signal-to-noise ratio and structural similarity index increased from 25.12 and 0.5807 to 27.78 and 0.8505, respectively (P<0.005 for all comparison). For the real motion testing set, the motion-compensated images generated by the network showed reduced motion artifacts and improved image quality compared to the input motion-corrupted images.

The example embodiment of a deep convolutional neural network can provide an efficient and effective approach for motion compensation in spiral brain imaging.

During MRI acquisition, subject motion can severely degrade the resulting images by introducing ghosting and blurring, which can lead to serious confounding effects for subsequent diagnoses. Approximately 20% of clinical MR examinations are affected by patient motion and require a rescan [1B]. Numerous methods to reduce or compensate head motion in MRI have been proposed over the past 20 years [2B]. The motion can be tracked by external sensors, such as optical cameras [3B, 4B], or be estimated by the application of MR navigators [5B-10B]. Motion information obtained from sensors or navigators can then be applied for motion compensation either prospectively [11B] or retrospectively [12B]. However, these methods can require extra monitoring devices or sequence modifications, which limits the wide application of these methods.

Convolutional neural networks (CNNs) trained with paired MR images can be utilized to solve problems like image segmentation [13B], undersampled image reconstruction [14B], multi-contrast image synthesis [15B], and image denoising [16B]. Specifically, there have been several proposed deep learning-based techniques for motion compensation, demonstrating promising results. Johnson and Drangova [17B] implemented a pix2pix-based network to correct for 3D rigid-body motion. Kustner et al [18B] investigated the influence of network architecture and introduced their MedGAN architecture with style transfer loss. Lee et al [19B] combined a registration network and a multi-input, multi-output network to perform motion compensation for multi-contrast MRI. Haskell et al [20B] incorporated a trained CNN into a model-based motion minimization framework.

While the above methods have demonstrated the capability of CNNs in reducing motion artifacts, all of them are based on the Cartesian k-space sampling pattern. Compared to the Cartesian trajectory, spiral trajectories offer the advantages of shorter scan time and higher flow insensitivity [21B, 22B], which make it an excellent alternative scheme for k-space sampling. Spiral sampling is widely used in cardiac imaging [23B], temperature imaging [24B], and functional MRI [25B] for its higher scan efficiency. One major source of artifacts for spiral imaging is off resonance effects. A residual CNN can be used to deblur off resonance distorted spiral images [26B].

The example embodiments of the present disclosure can include a conditional generative adversarial network (GAN) for motion compensation, whether spiral or Cartesian. Non-limiting examples of this disclosure include in-plane rigid motion artifacts being simulated based on various spiral sampling patterns. The spiral sampling patterns are examples only and do not limit embodiments herein. The network, therefore, was trained to learn the mapping between motion-corrupted and motion-free images. Since in these examples, and without limiting the disaclosure, the network operates in the image domain to predict output images from motion-corrupted images, no a-priori information is needed for the motion compensation. The example method was evaluated with both simulated and in vivo testing data sets.

It can be difficult to get a large number of matched motion-free and motion-corrupted image pairs for supervised network training. Therefore, images with intershot in-plane rigid motion artifacts can be simulated from motion-free images. An open-source dataset (https.//brain-development.org/ixi-dataset/) containing axial T2-weighted, Cartesian turbo-spin-echo (TSE) magnitude images for 578 healthy subjects was used in this study. The imaging parameters were TR=5.7 s at one institute and TR=8.2 s at another institute, TE=100 ms, echo train length (ETL)=16, slice thickness=1.2 mm, in-plane field of view (FOV)=240×240 mm$^2$, and image matrix size=256×256. Detailed scan parameters can be found on the project website. Data from 347 of the subjects (14436 slices) were used for training and validation, and data from the remaining 231 subjects (8120 slices) were used for testing the network performance.

Assume an ideal motion-free image $x_0$, and a spatial transformation matrix A that operates in the image domain to move pixel values from one location to another [27B]. For multishot spiral imaging, all of the k-space spiral interleaves are divided into M sets, where each set has a different spatial transformation matrix $A_m$, corresponding to a different motion state. Then the motion-corrupted k-space data y can be written as:

$$y = \Sigma_{M=0}^{M-1} S_m F A_m x_0 \quad (1)$$

F is the nonuniform Fourier basis matrix, and Fx can be evaluated quickly through the nonuniform fast Fourier transform (NUFFT) [28B, 29B]. $S_m$ extracts the spiral interleaves in set m, with its diagonal element equal to 1 if the corresponding k-space sample belongs to set m, and equal to 0 otherwise. By applying an adjoint NUFFT, the motion-corrupted image can be obtained as follows:

$$x = F^T W y = \Sigma_{m=0}^{M-1} W S_m F A_m x_0 \quad (2)$$

where the superscript T denotes conjugate transpose, and W is the density compensation function for nonuniform sampling.

Figures 12A, 12B:
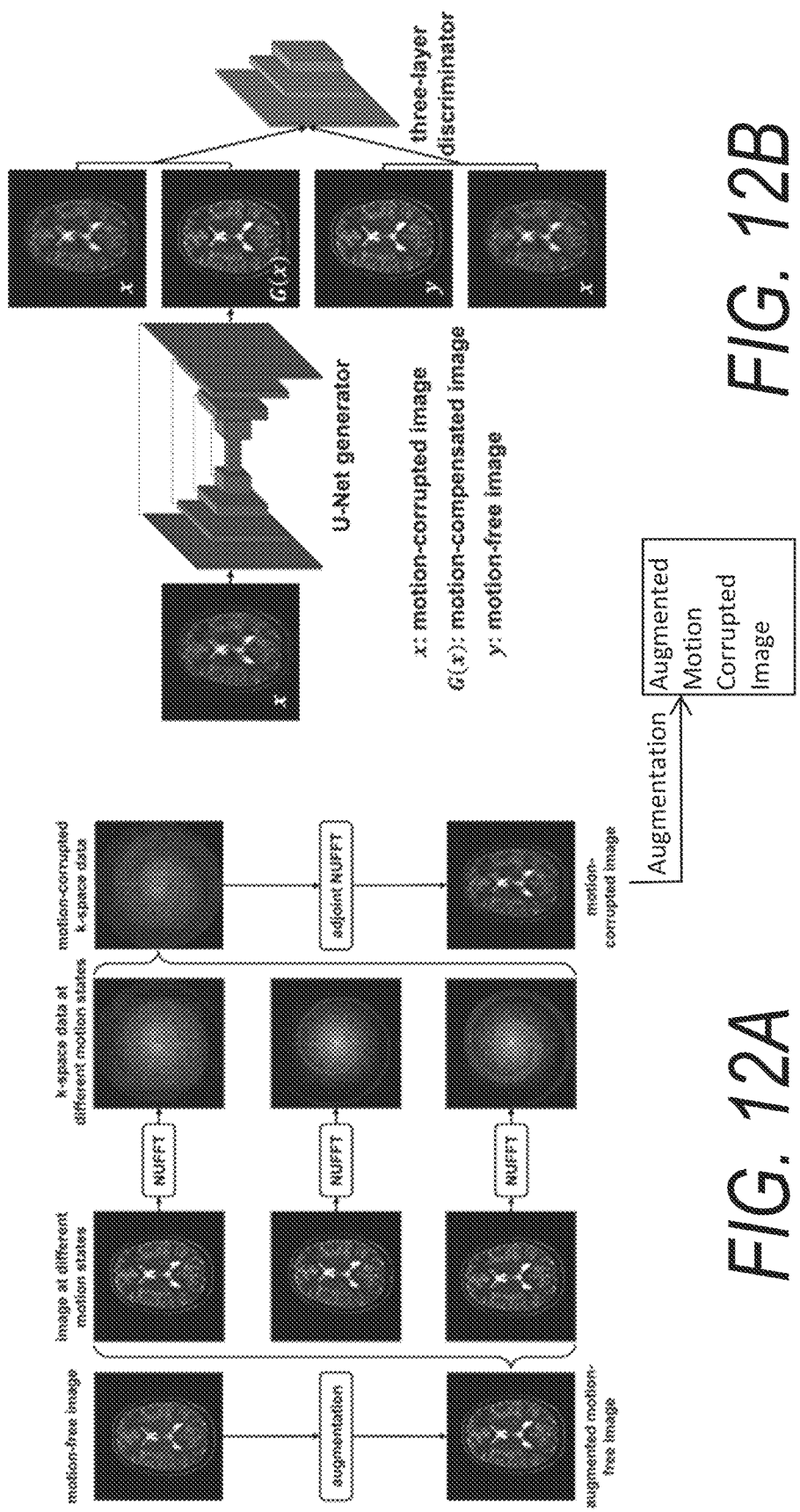

The above procedures are shown in FIG. 12A. Spiral trajectories used in the simulation were generated based on the image FOV and resolution [30B], including constant density, variable density, and dual density spiral trajectories with different numbers of interleaves. For each image in the training dataset, the number of motion events was randomly selected from {1, 2, 3}; in other words, the corresponding k-space spiral interleaves were randomly divided into 2, 3, or 4 sets, where the additional set contains the interleaves that were not affected by motion. The in-plane horizontal and vertical translations were sampled from a normal distribution with mean=0 mm and standard deviation=3 mm and the in-plane rotation was sampled from a normal distribution with mean=0° and standard deviation=3°. To prevent overfitting and improve network robustness, we applied several types of augmentation, including random shift, rotation, horizontal/vertical flip, and contrast stretching, before the simulation. The parameters used in motion simulation and training augmentation were summarized in the table shown in FIG. 12C.

Figure 13:
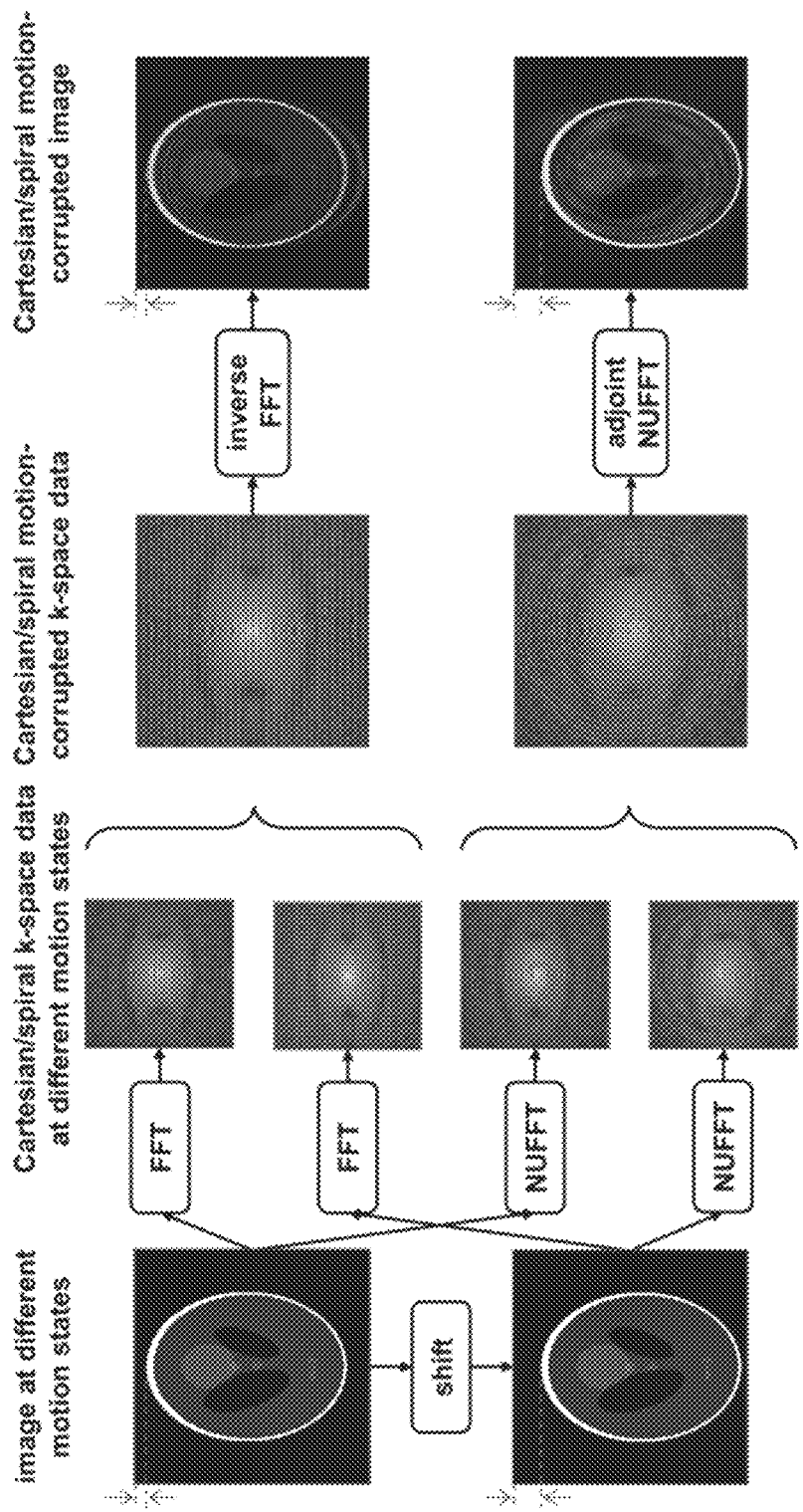
FIG. 13 illustrates differences between Cartesian and spiral motion simulation. The k-space lines or interleaves from two different motion states are extracted and combined to form the motion-corrupted k-space data. according to an example embodiment of the present disclosure.

The above equation can also be used to describe the motion corruption for Cartesian imaging if F is replaced by the uniform Fourier basis matrix and W equals the identity matrix. However, differences can exist between Cartesian and spiral motion simulation. In a simulated motion-corrupted image, the general object position is supposed to be the same as in its paired motion-free image. Otherwise, the misregistration will increase the complexity of the problem for the network to learn. For Cartesian imaging, this purpose can be achieved by keeping a small partition of phase-encoding lines in the central k-space uncorrupted, meaning that $A_m$ is equal to the identity matrix I for these lines, since the central lines contain the low spatial frequency content and determine the overall image contrast and object location, as shown in FIG. 13. For spiral imaging, each k-space interleave can contain both low and high spatial frequency content. Thus, to maintain the object position, $A_m$ can be set equal to I for the k-space set possessing the majority of spiral interleaves. Another difference to be noted in FIG. 13 is that the motion artifacts can predominantly propagate in the phase-encoding direction for Cartesian imaging, while for spiral imaging there is not a fixed phase-encoding direction and the artifacts can appear in all directions.

To compensate the motion artifacts, embodiments of the present disclosure include a trained a conditional GAN [31B], which includes a generator (G) and a discriminator (D), as shown in FIG. 12B. The generator network can include 4 encoding blocks and 4 decoding blocks [13B]. Each encoding block contains a strided convolution layer with stride 2, instead of the max pooling operation in the original U-Net, followed by a batch normalization and a rectified linear unit (ReLU). In a decoding block, the strided convolution layer is replaced by the transposed convolution (also referred to as fractional-strided convolution) layer to perform upsampling. Skip connections between encoding and decoding blocks are achieved by concatenating the feature maps from both sides. The input to the generator is a 2D motion-corrupted magnitude image, which is scaled to range −1 to 1. The final layer of the generator is a convolution followed by a tanh activation function to generate the motion-compensated image within range −1 to 1. All convolution layers have a 4×4 kernel size. The discriminator consists of three convolution-batch normalization-leaky ReLU blocks, and a final convolution layer to generate the patchGAN [31B] prediction map. The input to the discriminator is either a combination of the motion-corrupted image and the target motion-free image, or a combination of the motion-corrupted image and the motion-compensated image from the generator. It should be understood that the particular combination of layers, blocks, and values given in this example are intended only as non-limiting examples, and that the use of other network parameters and architectures is contemplated.

The generator and discriminator were trained with the following objective $$\mathcal{L}_D = \mathcal{L}_D^{cSGAN} = (D(x,y)-1)^2 + D(x,G(x))^2 \quad (3)$$

$$\mathcal{L}_G = \mathcal{L}_G^{cLSGAN} + \lambda \mathcal{L}_{L1} = (D(x,G(x))-1)^2 + \|y - G(x)\|_1 \quad (4)$$

where $\mathcal{L}_D^{cLSGAN}$ and $\mathcal{L}_G^{cLSGAN}$ are objectives for the conditional least squares GAN (LSGAN)[32]. Compared to the original GAN, LSGAN has more stable performance during the learning process. $\mathcal{L}_{L1}$ measures the L1 distance between the generated motion-compensated image and the target motion-free image. The network was implemented in PyTorch [33B] and optimized using the Adam optimizer [34B] with an initial learning rate of 0.0002 and momentum parameters $\beta_1=0.9$ and $\beta_2=0.999$. The hyper-parameter $\lambda$ was set to 100, and batch size was set to 16. The total training time on a Nvidia Titan Xp GPU was about 18 hours.

The spiral motion compensation network can be applied to unseen images with simulated motion artifacts to test its performance. For each image in the testing dataset, the number of motion events is set to be 1 or 2. The in-plane horizontal and vertical translations were sampled from a uniform distribution with zero mean and width 12 mm, and the in-plane rotation was sampled from a uniform distribution with zero mean and width 12°. After motion simulation, each slice in the testing dataset was scaled to −1 to 1 and passed through the network. For quantitative evaluation of the image quality improvement, normalized root-mean-square error (NRMSE), peak signal-to-noise ratio (PSNR), and structural similarity index (SSIM) [35B] between the motion-free target image and the motion-corrupted input image or the motion-compensated output image were calculated. Further descriptions of these metrics are provided in Supporting Information. Paired t-tests with α=0.005 were performed to determine the significance of the difference in the metrics before and after motion compensation. To test the limits of the network, a subset (100 slices) was randomly selected from the testing dataset. Each slice in the subset was simulated with different levels of motions. The motion level was calculated with the method proposed by Tisdall et al [36B]:

$$\text{maximum displacement} = \frac{64}{\sqrt{[1-\cos(|\theta|)]^2 + [\sin(|\theta|)]^2 + \Delta x^2 + \Delta y^2}} \quad (5)$$

where θ is the in-plane rotation and Δx and Δy are the in-plane translations. This equation estimates the maximum displacement of any point on a circle with 64 mm radius. After applying the network to these simulated motion-corrupted images, NRMSE, PSNR and SSIM were evaluated.

Additionally, the network was applied to in vivo data collected from two healthy subjects. T2-weighted images were acquired on a 1.5T scanner (MAGNETOM Avanto; Siemens Healthcare; Erlangen, Germany) with a constant density spiral TSE sequence. Scan parameters were TR=3.0 s, TE=88 ms, ETL=15, slice thickness=5 mm, in-plane FOV=250×250 mm², image matrix size=256×256. Subjects were instructed to shake their heads in the axial plane during the 50 second scan to generate rigid in-plane motion artifacts. The reconstructed magnitude images were used as the input to the network. Imaging studies were performed under institutional review board-approved protocols, and written informed consent from all subjects were given.

Figure 14A:
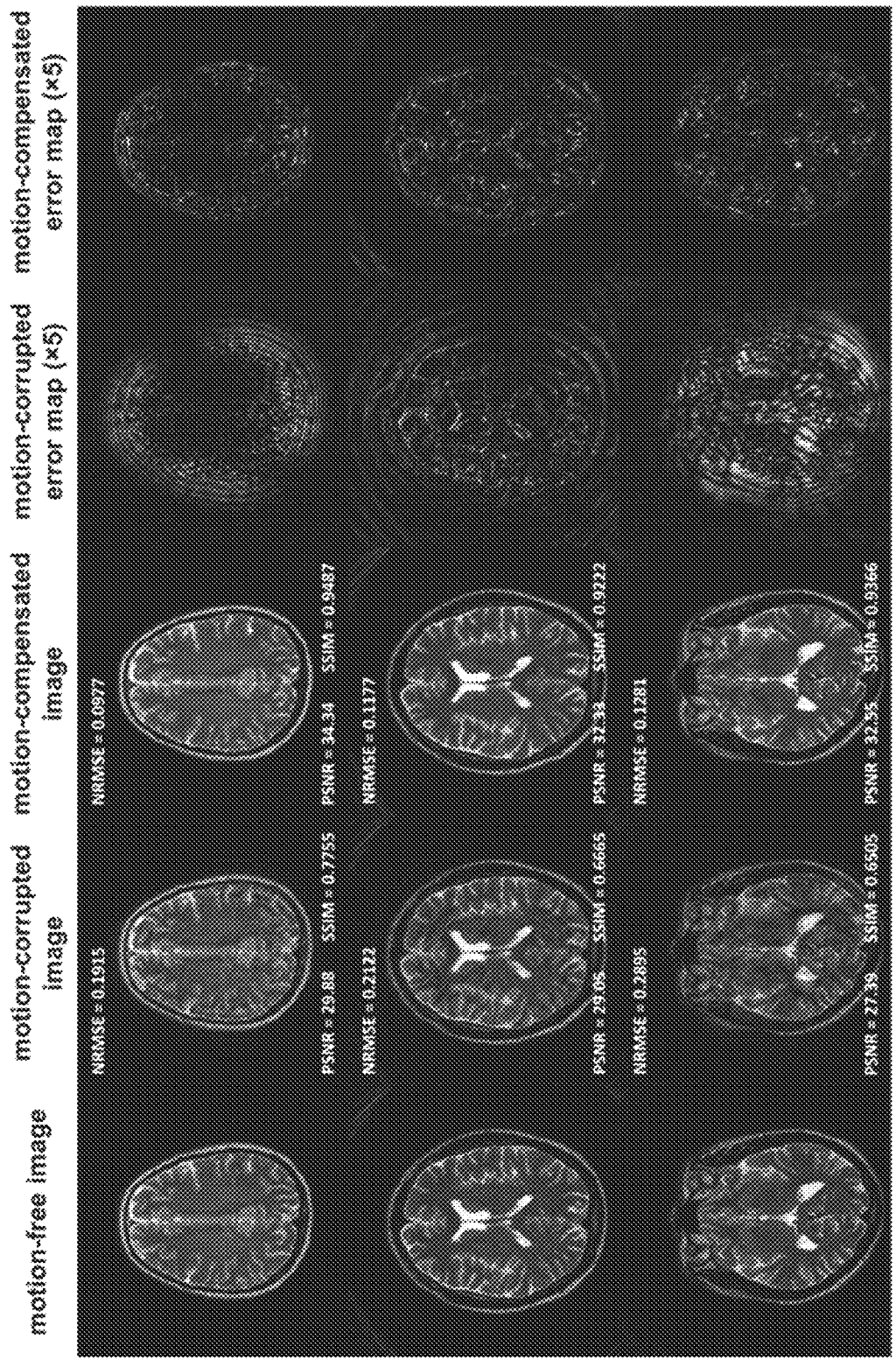
Figure 15A:
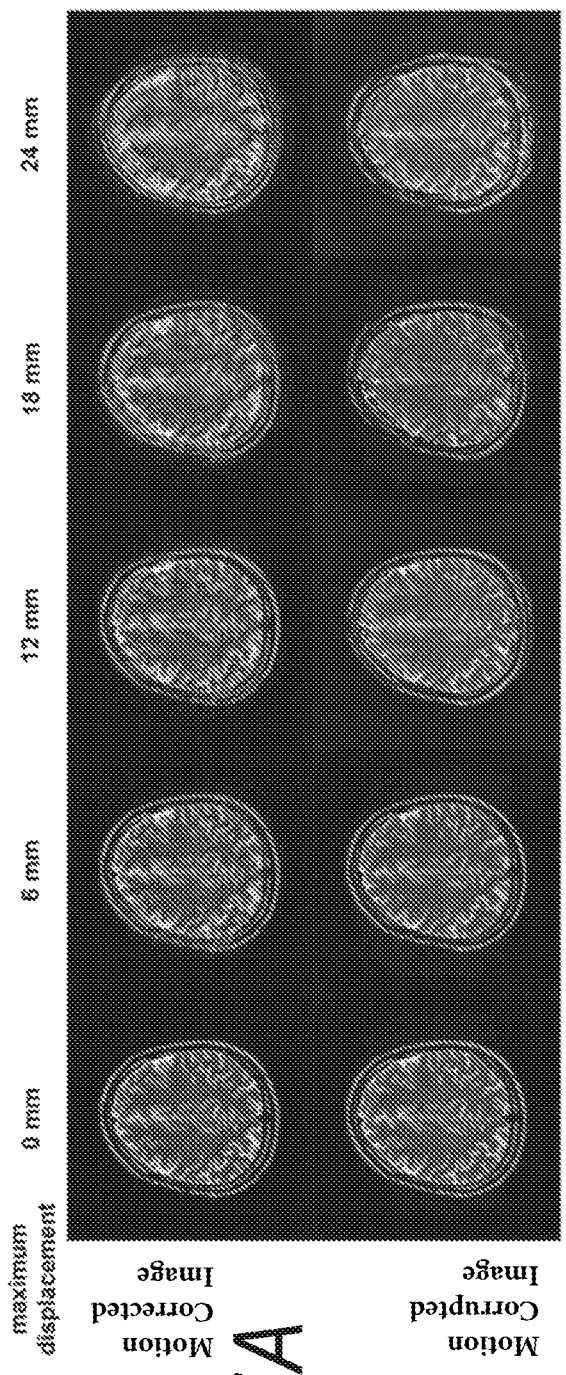
FIGS. 15A-15B illustrate representative motion compensation results for an example embodiment of the present disclosure.

Representative slices from the simulated motion testing dataset are shown in FIG. 14A. Compared with motion-corrupted images, motion-compensated images generated by the network show reduced motion artifacts and higher image quality, as indicated by the improved NRMSE, PSNR and SSIM. For the whole simulated motion testing dataset, after motion compensation, the average NRMSE decreased from 0.3439 to 0.2050, and the average PSNR and SSIM increased from 25.12 and 0.5807 to 27.78 and 0.8505, respectively. The quantitative evaluation results are summarized in FIG. 14B. Paired t-tests showed that the differences between the metrics before and after motion compensation are statistically significant (P<0.005). To test the limits of the network, 100 randomly selected testing slices were simulated with different levels of motion. A representative slice is shown in FIG. 15A. The image quality of the motion-compensated image became worse as the maximum displacement became larger. The average NRMSE, PSNR, and SSIM of the 100-slices subset over the maximum displacement are plotted in FIG. 15B. As indicated by the PSNR curve, the network performance noticeably drops when the maximum displacement is larger than 15 mm, although there is still substantial improvement in image quality from motion compensation.

Figure 16:
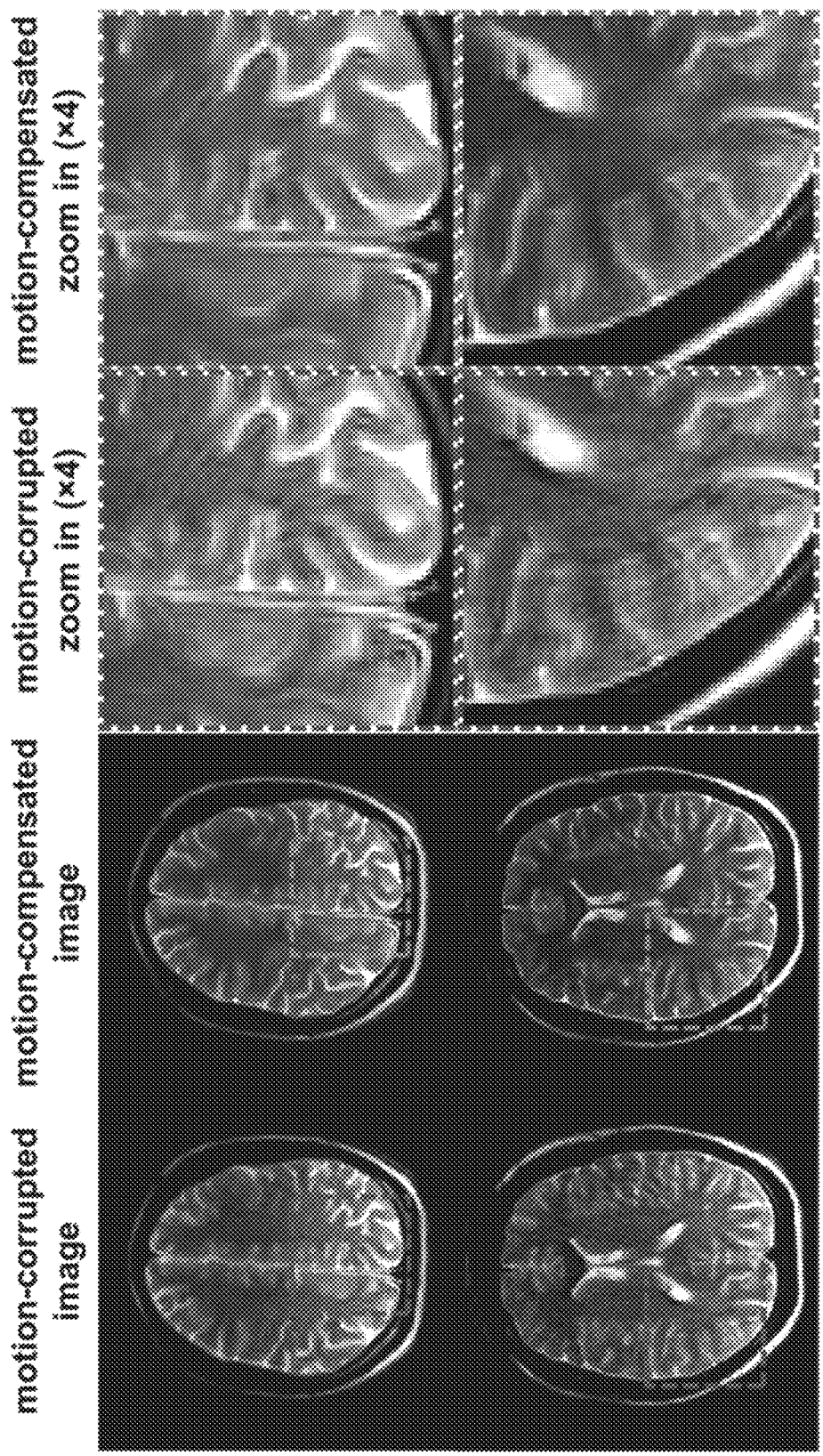
FIG. 16 illustrates motion compensation results for in vivo spiral motion artifacts from two subjects according to an example embodiment of the present disclosure.

FIG. 16 shows the results for in vivo real motion data from two healthy subjects. Substantial motion artifacts and blurring are clearly observed in the images before motion compensation due to subject movements during the scan. By applying the trained network, the artifacts are well suppressed, and the structures become sharper in the output images. For a single slice, the average processing time including the network inference time and image I/O time was about 90 ms.

In this non-limiting example implementation, the deep learning-based method compensated for motion artifacts for spiral trajectories without a-priori information. A conditional GAN model was trained with paired images synthetically generated by simulating in-plane rigid motion artifacts. The trained model successfully improved the image quality on both the simulated dataset and the real motion dataset.

The training dataset used for this study consisted of 347 subjects. Compared to previous studies [17B-20B], this is a relatively large dataset. The images were all collected from normal, healthy subjects, and pre-processed with the same procedures. To avoid overfitting, random augmentations were employed to increase the diversity of the training set. The validation loss was also monitored after each epoch during model training. A more varied dataset from multiple institutions with different scanning parameters and different pre-processing procedures should help improve the model robustness.

A pix2pix architecture, which has been demonstrated for Cartesian motion compensation in prior work [17B]. Compared to a stand-alone U-Net trained with L1 loss, the pix2pix model combined L1 loss and conditional GAN loss, which not only enforces the fidelity of the image but also encourages less blurring [31B]. Recently, unsupervised learning and semi-supervised learning-based methods have been investigated in image reconstruction or denoising tasks [37B,38B]. Considering the difficulty of collecting a large number of paired training images, these methods may also be applied for motion compensation.

Figure 15B:
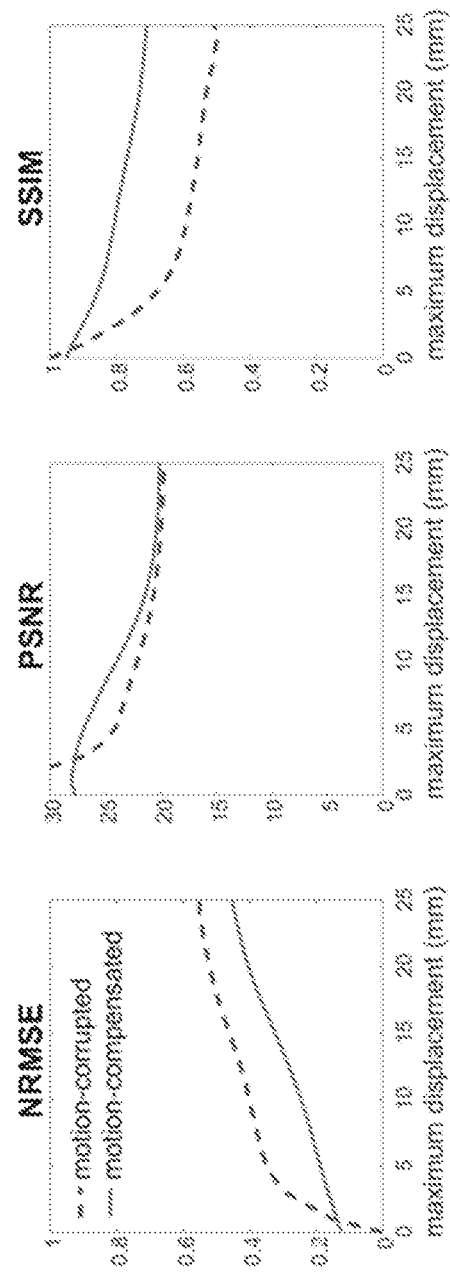

Unlike Cartesian imaging in which the motion artifacts can mainly appear as ghosts in the phase-encoding direction, motion in spiral imaging causes artifacts in all directions. Three widely used spiral sampling patterns (constant density, variable density, and dual density) were considered in this example. FIGS. 15A-15B illustrate that the network performance can diminish for bulk motion larger than 15 mm. Considering the self-navigation properties of spiral trajectories, especially the highly oversampled central region in dual density spirals, the bulk motion information can be estimated and compensated with spiral motion compensation techniques [39B, 40B]. The combination of embodiments of the present disclosure including a deep learning-based method and other techniques can further improve the image quality. Additionally, it should be understood that, although the present examples are only related to in-plane rigid motion is involved, through-plane motion in the motion simulation and transforming from a 2D network to a 3D network can improve performance on real motion datasets.

Example 4

Yet another example embodiment of the present disclosure was implemented and tested. The example embodiment can use spiral scan sampling with a deep convolutional neural network to remove motion artifacts for spiral brain imaging [1C, 2C]. An open-source data set (http://www.brain-development.org) containing T2-weighted, Cartesian TSE magnitude images for 578 subjects was used. The imaging parameters were TR=5.7 s, TE=100 ms, in-plane "field of view=240×240 mm$^2$, matrix size=256×256, and echo train length (ETL)=16. Data from 347 of the subjects were used for training and validation, and data from the remaining 231 subjects were used for testing the network performance. Again, the field of view, matrix sizes, and other imaging parameters given with reference to this example embodiment are intended only as non-limiting examples.

Figure 17:
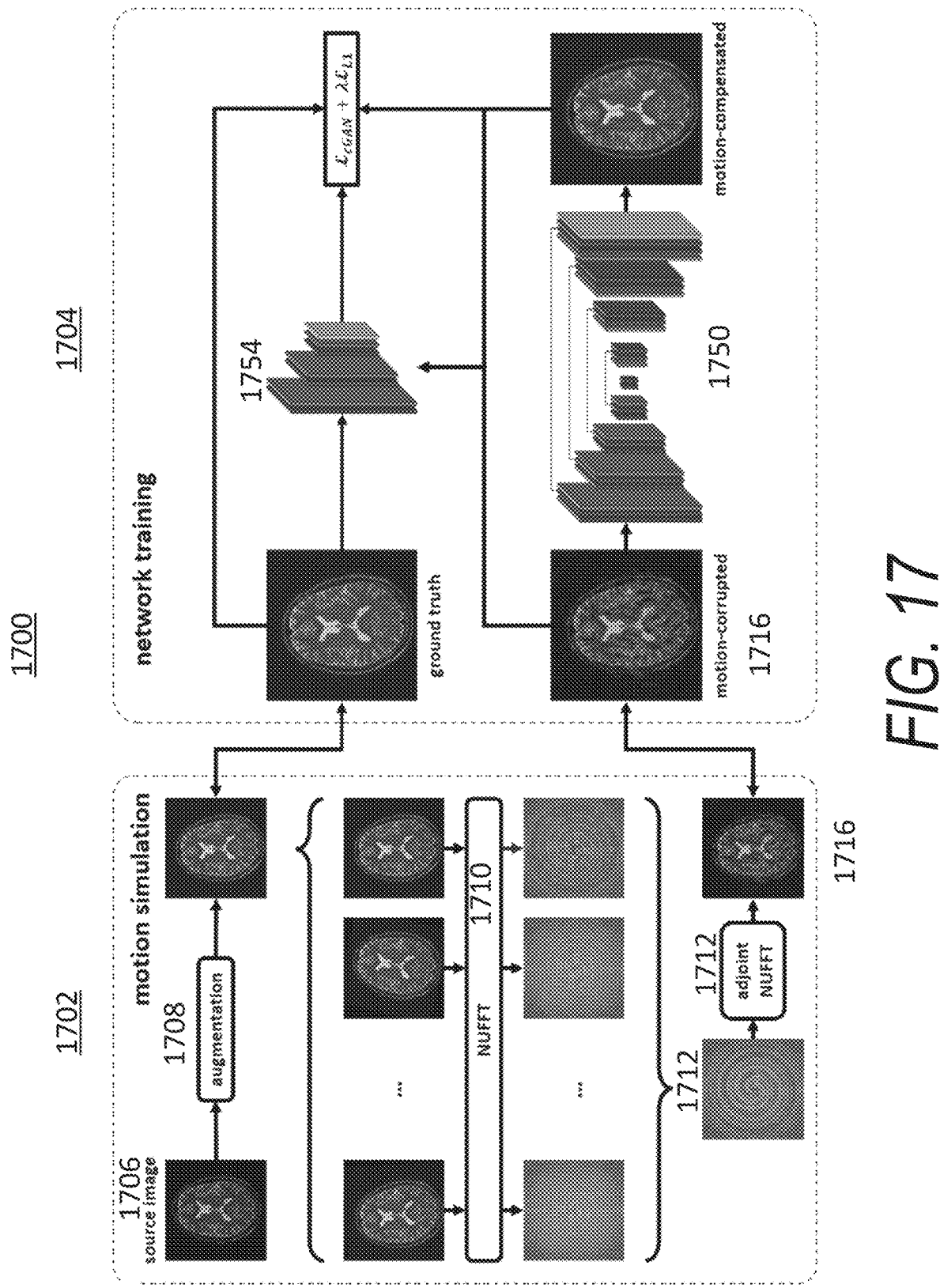
FIG. 17 illustrates an architecture for performing motion simulation for spiral sampling according to an example embodiment of the present disclosure.

FIG. 17 illustrates another example architecture for another example embodiment of the present disclosure. The architecture can include a module 1702 for motion simulation and a module 1704 for network training. The motion simulation module 1702 can operate on a source image 1706. To simulate motion artifacts for spiral imaging, constant density, variable density, and dual density spiral trajectories were generated based on the image FOV and resolution. The images can be transformed 1710, for example using a nonuniform fast Fourier transform. After combining 1712 k-space spiral interleaves from different motion states, an adjoint nonuniform fast Fourier transform 1714 [3C, 4C] can be applied to the combined k-space to obtain a motion-corrupted image 1716, as shown in FIG. 17. Parameters related to motion simulation are summarized in FIG. 18, including the ranges and distributions of the translation, rotation, and the ratio of motion-affected spiral interleaves. To improve network robustness and save training time, augmentations 1708 including random shift, rotation, horizontal/vertical flip, and contrast stretching were performed before the simulation.

Again referring to FIG. 17, the network training module 1704 can be configured for training. The network can include a U-Net generator (G) 1750 and a three-layer discriminator (D) 1754 [5C, 6C]. The generator 1750 can be trained to minimize the combined conditional generative adversarial network (cGAN) loss and L1 loss $\mathcal{L}_{cGAN}$(G, D)+λ$\mathcal{L}_{L1}$(G), where A was set to 100 empirically. The network was implemented in PyTorch [7C] and optimized using Adam [8C] with learning rate 0.0002. The structural similarity index (SSIM), peak signal-to-noise ratio (PSNR), root mean square error (RMSE) and absolute difference (ABSD) were calculated as image quality metrics. The trained network was also applied on images acquired from a healthy volunteer who was asked to move their head during a spiral TSE scan on a 1.5 T scanner (MAGNETOM Avanto, Siemens Healthcare, Erlangen, Germany). The parameters for spiral imaging were TR=3 s, TE=91 ms, in-plane "field of view=240×240 mm, matrix size=256×256, and ETL=15. Again, the spiral imaging parameters and other model parameters are intended only as non-limiting examples.

Figure 19:
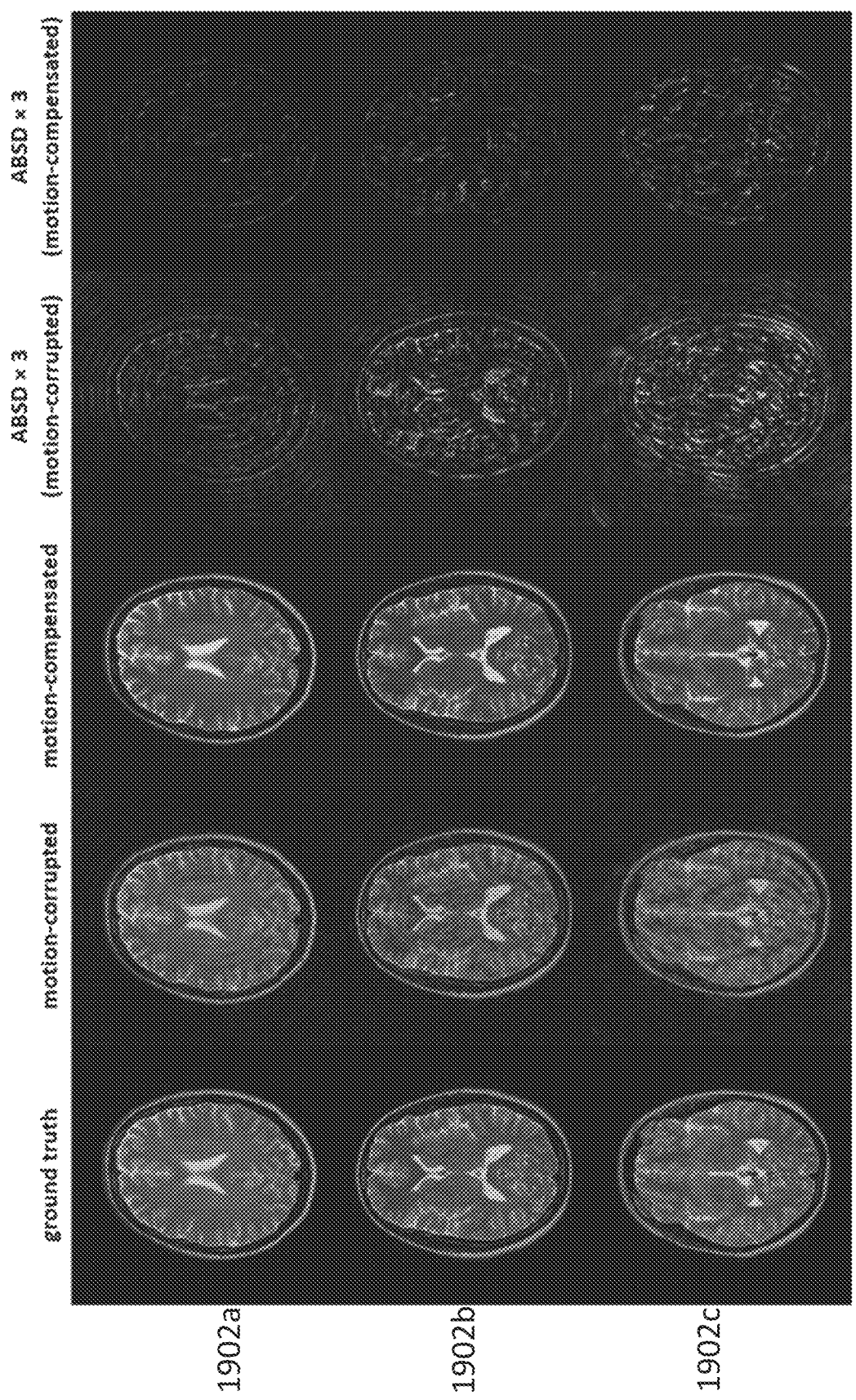
FIG. 19 illustrates representative motion compensation results on simulated data from subjects according to an example embodiment of the present disclosure.
Figure 20:
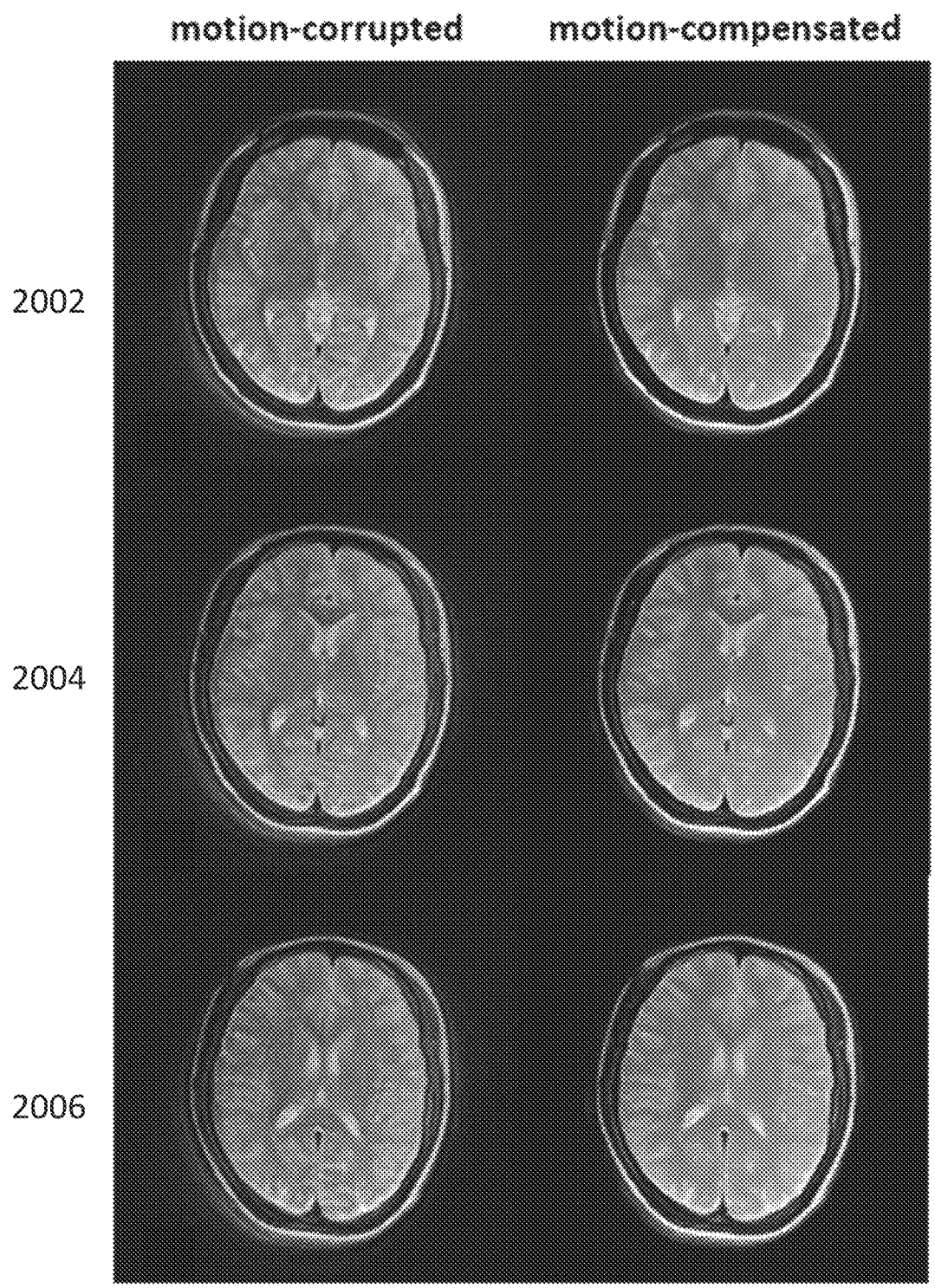
FIG. 20 illustrates motion compensation results on in vivo data in three slices where motion artifacts and blurring are reduced in each slice according to an example embodiment of the present disclosure.

FIG. 19 shows the network performance on the test subjects with simulated spiral motion artifacts. Each row 1902a 1902b 1902c corresponds to one of three different test subjects. The motion-compensated images show fewer artifacts and higher quality compared to the motion-corrupted images. Quantitatively, the average SSIM and PSNR were increased from 0.6659 and 24.20 to 0.8965 and 26.36, respectively, after motion compensation. The average RMSE and ABSD were decreased from 0.0661 and 0.0492 to 0.0393 and 0.0221, respectively. The network performance on the in vivo data is shown in FIG. 20, including results from a first slice 2002, second slice 2004, and third slice 2006. The motion artifacts and blurring are reduced in each slice. The motion-corrupted images showed substantial motion artifacts, and these artifacts were significantly reduced in the motion-compensated images. The average time for processing a single slice was less than 100 ms (not including the I/O time) on a 12 GB NVIDIA TITAN Xp GPU.

Embodiments of the present disclosure can include a DCNN that can compensate motion for spiral brain imaging. The network can operate retrospectively in the image domain. The network performance of the example embodiment on both simulated data and in vivo data shows fast and effective artifact reduction was achieved in both cases. The present disclosure can also be used with methods to minimize contrast loss and blurring in motion-compensated images and additional in vivo testing.

Example 5: Image Quality Metrics

In addition to the preceding examples, the present disclosure contemplates that image quality metrics can be used to evaluate the operation of various embodiments of the present disclosure and/or as inputs or outputs into the machine learning models of the present disclosure. In the following equations, x denotes the motion-corrupted input image or the motion-compensated output image with size m×n, y denotes the motion-free target image. Both x and y are normalized with respect to y before metric calculation.

$$NRMSE(x, y) = \sqrt{\frac{MSE(x, y)}{MSE(y, 0)}} \qquad \#(1)$$

where $MSE(x, y) =$ $$\frac{\sum_{i=0}^{m-1} \sum_{j=0}^{n-1} (x_{ij} - y_{ij})^2}{mn} \text{ is the mean–square error between } x \text{ and } y.$$

$$NRMSE(x, y) = \sqrt{\frac{MSE(x, y)}{MSE(y, 0)}} \qquad \#(1)$$

$$SSIM(x, y) = \frac{(2\mu_x\mu_y + c_1)(2\sigma_{xy} + c_2)}{(\mu_x^2 + \mu_y^2 + c_1)(\sigma_x^2 + \sigma_y^2 + c_2)} \qquad \#(3)$$

where $\mu_x =$ $$\frac{\sum_{i=0}^{m-1} \sum_{j=0}^{n-1} x_{ij}}{mn} \text{ and } \mu_y = \frac{\sum_{i=0}^{m-1} \sum_{j=0}^{n-1} y_{ij}}{mn} \text{ are the means of } x \text{ and } y,$$

$$\sigma_x^2 = \frac{\sum_{i=0}^{m-1} \sum_{j=0}^{n-1} (x_{ij} - \mu_x)^2}{mn} \text{ and } \sigma_y^2 =$$

$$\frac{\sum_{i=0}^{m-1} \sum_{j=0}^{n-1} (y_{ij} - \mu_y)^2}{mn} \text{ are the variances of } x \text{ and } y,$$

$$\sigma_{xy} = \frac{\sum_{i=0}^{m-1} \sum_{j=0}^{n-1} (x_{ij} - \mu_x)(y_{ij} - \mu_y)}{mn} \text{ is the cross–covariance of } x \text{ and } y,$$

and $c_1 = 0.01$ and $c_2 = 0.03$ are regularization constants.

A computer-implemented method of training a neural network to correct motion-induced artifacts in magnetic resonance images begins with acquiring original frames of motion free magnetic resonance image (MRI) data of a target object in the image domain and applying a spatial transformation matrix to the original frames of motion free MRI data. This produces multiple frames of MRI data having respective motion states in the image domain. By applying a Non-uniform Fast Fourier Transform (NUFFT)

to each of the multiple frames of MRI data having respective motion states, the method generates respective k-space data sets corresponding to each of the multiple frames of MRI data having respective motion states. The method steps include but are not limited to combining the respective k-space data sets to produce a motion corrupted k-space data set of MRI data and applying an adjoint NUFFT to the motion corrupted k-space data set. The adjoint NUFFT is essentially an inverse transform that can use k-space data for forming respectively updated frames of motion corrupted MRI data in the image domain. The respectively updated frames of motion corrupted MRI data can be used to train a neural network that generates output frames of motion compensated MRI data.

Neural networks are often trained in iterative steps. For each iteration of training the neural network, this disclosure includes forming an image pairing of an original frame of motion-free MRI data and a respectively updated frame of motion-corrupted MRI data. The neural network is trained by applying a respective image pairing to the neural network. For each iteration of training the neural network, augmenting the original frames of motion free MRI data and the respectively updated frames of motion corrupted MRI data can form augmented frames of motion free MRI data and augmented frames of motion corrupted MRI data in the image domain. These augmentations are used to provide more robust training with diverse kinds of images. The augmenting can include, but is not limited to, applying in-plane rotations, horizontal flips, and/or vertical flips to the original frames. A different augmentation may be used for each iteration of training. The different augmentations may be applied simultaneously to both the original frames of motion free MRI data and the respectively updated frames of motion corrupted MRI data provided to the neural network at the same time.

In non-limiting embodiments, training the neural network includes training a generative adversarial network with the augmented frames of motion-free MRI data and the augmented frames of motion corrupted MRI data in the image domain. Training the generative adversarial network may be accomplished by applying the augmented frames of motion-corrupted MRI data to a generator in the generative adversarial network to produce respective motion compensated images accessible by a discriminator in the generative adversarial network. Training the generative adversarial network may include applying the original frames of motion free MRI data, the augmented frames of motion-corrupted MRI data and the respective motion compensated images to a discriminator within the generative adversarial network. These inputs to the neural network are not limiting of this disclosure and other combinations of inputs are within the scope of this disclosure.

For each iteration of training the neural network, the method may include, but is not limited to, grouping the augmented frames of motion-corrupted MRI data and the respective motion compensated images with a respective original frame of motion free MRI data for applying the group to the generative adversarial network simultaneously.

In another non-limiting embodiment, the augmented frames of motion-free MRI data are used as ground truth data for the generative adversarial network. Applying the augmented frames of motion corrupted MRI data to a generator in the generative adversarial network can produce motion compensated images. Training the generative adversarial network may include applying the ground truth data, the augmented frames of motion-corrupted MRI data and the motion compensated images to a discriminator within the generative adversarial network. The generative adversarial network is trained to minimize error functions evaluated according to differences between the ground truth data, the motion compensated images from the generator, and the augmented frames of motion corrupted MRI data.

In another non-limiting embodiment, this disclosure includes a computer-implemented method of training a neural network to correct motion-induced errors in magnetic resonance images by acquiring original frames of motion free magnetic resonance image (MRI) data of a target object. Fourier transforms are used to acquire respective original k-space data sets corresponding to each original frame. The method continues by applying a respective spatial transformation matrix to each original k-space data set to acquire motion state data for each original k-space data set. The computer then replaces portions of each original k-space data set with the motion state data to produce a transformed k-space MRI data set having a respective motion state and by combining the transformed k-space MRI data sets, the method produces a motion-corrupted k-space data set of MRI data. To return back to the image domain, the method includes applying an inverse Fourier transform to the motion-corrupted k-space data set and forming respective synthetic motion corrupted frames of MRI data. The synthetic motion corrupted frames of MRI data are used to train a neural network that generates output frames of motion compensated MRI data. Applying the spatial transformation matrix includes simulating in plane rigid motion artifacts from the original frames to produce the multiple frames of MRI data having the respective motion states. In some non-limiting embodiments, the Fourier transform is a Fast Fourier Transform and the k-space data sets are Cartesian k-space data sets. In other non-limiting embodiments, the Fourier transform is a Non-Uniform Fourier Transform and the k-space data sets are formed on spiral k-space trajectories. Replacing portions of each original k-space data set further includes replacing selected spiral interleaves in a respective k-space data set. Replacing selected spiral interleaves may include dividing all spiral interleaves in the motion-corrupted k-space data set into a selected number of sets, wherein each set is subject to a respective motion event corresponding to a respective spatial transformation matrix. In non-limiting embodiments, a number of spiral interleaves in each of the sets is randomly selected from a group of numbers including 8, 16, 32, 64, and 128. A spatial transformation of the spiral interleaves may include a type of spiral trajectory randomly selected from constant density, variable density, and dual density transformations. The number of sets is selected from 1, 2, 3, and 4 sets.

The computer implemented method may be incorporated into software stored on a non-transitory computer-readable medium. Stored instructions, when executed by one or more processors, cause a magnetic resonance imaging system to perform a computer implemented method that includes acquiring original frames of motion free magnetic resonance image (MRI) data of a target object; using Fourier transforms to acquire respective original k-space data sets corresponding to each original frame; applying a respective spatial transformation matrix to each original k-space data set to acquire motion state data for each original k-space data set; replacing portions of each original k-space data set with the motion state data to produce a transformed k-space MRI data set having a respective motion state; combining the transformed k-space MRI data sets to produce a motion-corrupted k-space data set of MRI data; applying an inverse Fourier transform to the motion-corrupted k-space data set and forming respective synthetic motion corrupted frames of MRI data in the image domain; and using the synthetic motion corrupted frames of MRI data to train a neural network that generates output frames of motion compensated MRI data.

A system for ungated magnetic resonance imaging may include a magnetic resonance imaging device configured to produce magnetic resonance imaging (MRI) data corresponding to a target and one or more processors in data communication with computer memory and the magnetic resonance imaging device, wherein the one or more processors are configured to cause the system to perform a computer implemented method. The method includes acquiring original frames of motion free magnetic resonance image (MRI) data of a target object; using Fourier transforms to acquire respective original k-space data sets corresponding to each original frame; applying a respective spatial transformation matrix to each original k-space data set to acquire motion state data for each original k-space data set; replacing portions of each original k-space data set with the motion state data to produce a transformed k-space MRI data set having a respective motion state; combining the transformed k-space MRI data sets to produce a motion-corrupted k-space data set of MRI data; applying an inverse Fourier transform to the motion-corrupted k-space data set and forming respective synthetic motion corrupted frames of MRI data in the image domain; and using the synthetic motion corrupted frames of MRI data to train a neural network that generates output frames of motion compensated MRI data.

The specific configurations, choice of materials and the size and shape of various elements can be varied according to particular design specifications or constraints requiring a system or method constructed according to the principles of the present disclosure. Such changes are intended to be embraced within the scope of the present disclosure. The presently disclosed embodiments, therefore, are considered in all respects to be illustrative and not restrictive. The patentable scope of certain embodiments of the present disclosure is indicated by the appended claims, rather than the foregoing description.

LIST OF REFERENCES

All references cited in this document are incorporated by reference as if set forth in full herein.
[1] Zhang K, Zuo W, Chen Y, Meng D, Zhang L. Beyond a gaussian denoiser: Residual learning of deep cnn for image denoising. IEEE Transactions on Image Processing. 2017 July; 26(7):3142-55.
[2] Bullitt E, Zeng D, Gerig G, Aylward S, Joshi S, Smith J K, Lin W, Ewend M G. Vessel tortuosity and brain tumor malignancy: a blinded study. Academic radiology. 2005 Oct. 1; 12(10):1232-40.
[3] Fessler J A. Michigan Image Reconstruction Toolbox. Available at https://web.eecs.umich.edu/-fessler/code/
[4] Lorch B, Vaillant G, Baumgartner C, Bai W, Rueckert D, Maier A. Automated Detection of Motion Artefacts in MR Imaging Using Decision Forests. Journal of medical engineering. 2017; 2017.
[5] Kingma D P, Ba J. Adam: A method for stochastic optimization. arXiv preprint arXiv:1412.6980. 2014 Dec. 22.
[6] Zhao H, Gallo O, Frosio I, Kautz J. Loss functions for image restoration with neural networks. IEEE Transactions on Computational Imaging. 2017 March; 3(1):47-57.

FIRST LIST OF SUPPLEMENTAL REFERENCES

[1A] Kustner, T., Armanious, K., Yang, J., Yang, B., Schick, F., & Gatidis, S. Retrospective correction of motion-affected MR images using deep learning frameworks. Magn Reson Med (2019 October). 82(4): 1527-1540.
[2A] Ong, F., & Lustig, M. SigPy: A Python Package for High Performance Iterative Reconstruction. In Proceedings of the 27th annual meeting of ISMRM (2019 May). Vol. 4819.
[3A] Ronneberger, O., Fischer, P., & Brox, T. U-net: Convolutional networks for biomedical image segmentation. Medical image computing and computer-assisted intervention (MICCAI) (2015 October). Vol. 9351, pp. 234-241. Springer.
[4A] Kingma, D. P., & Ba, J. Adam: A method for stochastic optimization. arXiv preprint arXiv:1412.6980 (2014 December).
[5A] Zhao, H., Gallo, O., Frosio, I., & Kautz, J. Loss functions for image restoration with neural networks. IEEE Transactions on Computational Imaging (2016 December). 3(1): 47-57.

SECOND LIST OF SUPPLEMENTAL REFERENCES

[1B] Andre J B, Bresnahan B W, Mossa-Basha M, et al. Toward Quantifying the Prevalence, Severity, and Cost Associated With Patient Motion During Clinical M R Examinations. $J A_m$ Coll Radiol. 2015; 12(7):689-695.
[2B] Zaitsev M, Maclaren J, Herbst M. Motion artifacts in MRI: A complex problem with many partial solutions. J Magn Reson Imaging. 2015; 42(4):887-901.
[3B] Zaitsev M, Dold C, Sakas G, Hennig J, Speck O. Magnetic resonance imaging of freely moving objects: prospective real-time motion correction using an external optical motion tracking system. Neuroimage. 2006; 31(3): 1038-1050.
[4B] Qin L, van Gelderen P, Derbyshire J A, et al. Prospective head-movement correction for high-resolution MRI using an in-bore optical tracking system. Magn Reson Med. 2009; 62(4):924-934.
[5B] Ehman R L, Felmlee J P. Adaptive technique for high-definition M R imaging of moving structures. Radiology. 1989; 173(1):255-263.
[6B] Hu X, Kim S G. Reduction of signal fluctuation in functional MRI using navigator echoes. Magn Reson Med. 1994 May; 31(5):495-503.
[7B] Sachs T S, Meyer C H, Hu B S, Kohli J, Nishimura D G, Macovski A. Real-time motion detection in spiral MRI using navigators. Magn Reson Med. 1994; 32(5):639-645.
[8B] Fu Z W, Wang Y, Grimm R C, et al. Orbital navigator echoes for motion measurements in magnetic resonance imaging. Magn Reson Med. 1995; 34(5):746-753.
[9B] Welch E B, Manduca A, Grimm R C, Ward H A, Jack C R Jr. Spherical navigator echoes for full 3D rigid body motion measurement in MRI. Magn Reson Med. 2002; 47(1):32-41.
[10B] van der Kouwe A J, Benner T, Dale A M. Real-time rigid body motion correction and shimming using cloverleaf navigators. Magn Reson Med. 2006; 56(5):1019-1032.
[11B] Maclaren J, Herbst M, Speck O, Zaitsev M. Prospective motion correction in brain imaging: a review. Magn Reson Med. 2013; 69(3):621-636.

[12B] Johnson P M, Liu J, Wade T, Tavallaei M A, Drangova M. Retrospective 3D motion correction using spherical navigator echoes. *Magn Reson Imaging*. 2016; 34(9):1274-1282.

[13B] Ronneberger O, Fischer P, Brox T. U-net: convolutional networks for biomedical image segmentation. 2015. arXiv:1505.04597 [cs.CV].

[14B] Schlemper J, Caballero J, Hajnal J V, Price A N, Rueckert D. A Deep Cascade of Convolutional Neural Networks for Dynamic M R Image Reconstruction. *IEEE Trans Med Imaging*. 2018; 37(2):491-503.

[15B] Chartsias A, Joyce T, Giuffrida M V, Tsaftaris S A. Multimodal M R Synthesis via Modality-Invariant Latent Representation. *IEEE Trans Med Imaging*. 2018; 37(3):803-814.

[16B] Jiang D, Dou W, Vosters L, Xu X, Sun Y, Tan T. Denoising of 3D magnetic resonance images with multi-channel residual learning of convolutional neural network. *Jpn J Radiol*. 2018; 36(9):566-574.

[17B] Johnson P M, Drangova M. Conditional generative adversarial network for 3D rigid-body motion correction in MRI. *Magn Reson Med*. 2019; 82(3):901-910.

[18B] Kustner T, Armanious K, Yang J, Yang B, Schick F, Gatidis S. Retrospective correction of motion-affected M R images using deep learning frameworks. *Magn Reson Med*. 2019; 82(4):1527-1540.

[19B] Lee J, Kim B, Park H. $MC^2$-Net: motion correction network for multi-contrast brain MRI. *Magn Reson Med*. 2021; 86(2):1077-1092.

[20B] Haskell M W, Cauley S F, Bilgic B, et al. Network Accelerated Motion Estimation and Reduction (NAMER): Convolutional neural network guided retrospective motion correction using a separable motion model. *Magn Reson Med*. 2019; 82(4):1452-1461.

[21B] Meyer C H, Hu B S, Nishimura D G, Macovski A. Fast spiral coronary artery imaging. *Magn Reson Med*. 1992; 28(2):202-213.

[22B] Nishimura D G, Irrarrazabal P, Meyer C H. A velocity k-space analysis of flow effects in echo-planar and spiral imaging. *Magn Reson Med*. 1995; 33(4):549-556.

[23B] Feng X, Salerno M, Kramer C M, Meyer C H. Non-Cartesian balanced steady-state free precession pulse sequences for real-time cardiac MRI. *Magn Reson Med*. 2016; 75(4):1546-1555.

[24B] Fielden S W, Feng X, Zhao L, et al. A spiral-based volumetric acquisition for M R temperature imaging. *Magn Reson Med*. 2018; 79(6):3122-3127.

[25B] Noll D C, Cohen J D, Meyer C H, Schneider W. Spiral K-space M R imaging of cortical activation. *J Magn Reson Imaging*. 1995; 5(1):49-56.

[26B] Lim Y, Bliesener Y, Narayanan S, Nayak K S. Deblurring for spiral real-time MRI using convolutional neural networks. *Magn Reson Med*. 2020; 84(6):3438-3452.

[27B] Batchelor P G, Atkinson D, Irarrazaval P, Hill D L, Hajnal J, Larkman D. Matrix description of general motion correction applied to multishot images. *Magn Reson Med*. 2005; 54(5):1273-1280.

[28B] Fessler J A. On NUFFT-based gridding for non-Cartesian MRI. *J Magn Reson*. 2007; 188(2):191-195.

[29B] Ong F, Lustig M. SigPy: A Python Package for High Performance Iterative Reconstruction. In Proceedings of the 27th Annual Meeting of ISMRM, Montreal, Canada, 2019. p. 4819.

[30B] Meyer C H, Pauly J M, Macovski A. A rapid, graphical method for optimal spiral gradient design. In Proceedings of the 4th Annual Meeting of ISMRM, New York, USA, 1996. p. 392.

[31B] Isola P, Zhu J Y, Zhou T, Efros A A. Image-to-image translation with conditional adversarial networks. 2016. arXiv:1611.07004 [cs.CV].

[32B] Mao X, Li Q, Xie H, Lau R Y K, Wang Z, Smolley S P. Least Squares Generative Adversarial Networks. 2016. arXiv:1611.04076 [cs.CV].

[33B] Paszke A, Gross S, Massa F, et al. PyTorch: An Imperative Style, High-Performance Deep Learning Library. 2019. arXiv:1912.01703 [cs.LG].

[34B] Kingma D P, Ba J. Adam: A Method for Stochastic Optimization. 2014. arXiv:1412.6980 [cs.LG].

[35B] Wang Z, Bovik A C, Sheikh H R, Simoncelli E P. Image quality assessment: from error visibility to structural similarity. *IEEE Trans Image Process*. 2004; 13(4):600-612.

[36B] Tisdall M D, Hess A T, Reuter M, Meintjes E M, Fischl B, van der Kouwe A J. Volumetric navigators for prospective motion correction and selective reacquisition in neuroanatomical MRI. *Magn Reson Med*. 2012; 68(2):389-399.

[37B] Cole E K, Pauly J M, Vasanawala S S, Ong F. Unsupervised MRI Reconstruction with Generative Adversarial Networks. 2020. arXiv:2008.13065 [eess.IV].

[38B] Eun D I, Jang R, Ha W S, Lee H, Jung S C, Kim N. Deep-learning-based image quality enhancement of compressed sensing magnetic resonance imaging of vessel wall: comparison of self-supervised and unsupervised approaches. *Sci Rep*. 2020; 10(1):13950.

[39B] Liu C, Bammer R, Kim D H, Moseley M E. Self-navigated interleaved spiral (SNAILS): application to high-resolution diffusion tensor imaging. *Magn Reson Med*. 2004; 52(6):1388-1396.

[40B] Weller D S, Wang L, Mugler J P 3rd, Meyer C H. Motion-compensated reconstruction of magnetic resonance images from undersampled data. Magn Reson Imaging. 2019; 55:36-45.

THIRD LIST OF SUPPLEMENTAL REFERENCES

[1C] Johnson, P. M., & Drangova, M. (2019). Conditional generative adversarial network for 3D rigidQbody motion correction in MRI. Magnetic Resonance in Medicine, 82(3), 901-910.

[2C] Haskell, M. W., Cauley, S. F., Bilgic, B., Hossbach, J., Splittho#, D. N., Pfeu#er, J., . . . & Wald, L. L. (2019). Network Accelerated Motion Estimation and Reduction (NAMER): Convolutional neural network guided retrospective motion correction using a separable motion model. Magnetic resonance in medicine, 82(4), 1452-1461.

[3C] Fessler, J. A., & Sutton, B. P. (2003). Nonuniform fast Fourier transforms using min-max interpolation. IEEE transactions on signal processing, 51(2), 560-574.

[4C] Ong, F., & Lustig, M. (2019, May). SigPy: A Python Package for High Performance Iterative Reconstruction. In Proceedings of the 27th annual meeting of ISMRM, Montreal (Vol. 4819).

[5C] Isola, P., Zhu, J. Y., Zhou, T., & Efros, A. A. (2017). Image-to-image translation with conditional adversarial networks. In Proceedings of the IEEE conference on computer vision and pattern recognition (pp. 1125-1134).

[6C] Ronneberger, O., Fischer, P., & Brox, T. (2015, October). U-net: Convolutional networks for biomedical image segmentation. In International Conference on Medical image computing and computer-assisted intervention (pp. 234-241). Springer, Cham.

[7C] Paszke, A., Gross, S., Massa, F., Lerer, A., Bradbury, J., Chanan, G., . . . & Desmaison, A. (2019). Pytorch: An imperative style, high-performance deep learning library. In Advances in neural information processing systems (pp. 8026-8037).

[8C] Kingma, D. P., & Ba, J. (2014). Adam: A method for stochastic optimization. arXiv preprint arXiv:1412.6980.

The invention claimed is:

1. A computer-implemented method of training a neural network to correct motion-induced artifacts in magnetic resonance images, comprising:
    acquiring original frames of motion free magnetic resonance image (MRI) data of a target object in the image domain;
    applying a spatial transformation matrix to the original frames of motion free MRI data and producing multiple frames of MRI data having respective motion states in the image domain;
    applying a Non-uniform Fast Fourier Transform (NUFFT) to each of the multiple frames of MRI data having respective motion states to generate respective k-space data sets corresponding to each of the multiple frames of MRI data having respective motion states;
    combining the respective k-space data sets to produce a motion corrupted k-space data set of MRI data;
    applying an adjoint NUFFT to the motion corrupted k-space data set and forming respectively updated frames of motion corrupted MRI data in the image domain; and
    using the respectively updated frames of motion corrupted MRI data to train a neural network that generates output frames of motion compensated MRI data.

2. The computer-implemented method of claim 1, further comprising:
    for each iteration of training the neural network, forming an image pairing of an original frame of motion-free MRI data and a respectively updated frame of motion-corrupted MRI data; and
    applying the image pairing to the neural network to train the neural network with each iteration.

3. The computer-implemented method of claim 1, further comprising, for each iteration of training the neural network:
    augmenting the original frames of motion free MRI data and the respectively updated frames of motion corrupted MRI data to form augmented frames of motion free MRI data and augmented frames of motion corrupted MRI data in the image domain.

4. The computer-implemented method of claim 3, wherein the augmenting comprises applying in-plane rotations, horizontal flips, and/or vertical flips to the original frames.

5. The computer implemented method of claim 3, further comprising utilizing a different augmentation for each iteration of training.

6. The computer implemented method of claim 5, wherein the different augmentation is applied to both the original frames of motion free MRI data and the respectively updated frames of motion corrupted MRI data provided to the neural network at the same time.

7. The computer implemented method of claim 3, wherein training the neural network comprises training a generative adversarial network with the augmented frames of motion-free MRI data and the augmented frames of motion corrupted MRI data in the image domain.

8. The computer implemented method of claim 7, further comprising training the generative adversarial network by applying the augmented frames of motion-corrupted MRI data to a generator in the generative adversarial network to produce respective motion compensated images accessible by a discriminator in the generative adversarial network.

9. The computer implemented method of claim 8, further comprising training the generative adversarial network by applying the original frames of motion free MRI data, the augmented frames of motion-corrupted MRI data and the respective motion compensated images to a discriminator within the generative adversarial network.

10. The computer implemented method of claim 9, wherein for each iteration of training the neural network, the method further comprises grouping the augmented frames of motion-corrupted MRI data and the respective motion compensated images with a respective original frame of motion free MRI data for applying the group to the generative adversarial network simultaneously.

11. The computer implemented method of claim 7, further comprising utilizing the augmented frames of motion-free MRI data as ground truth data for the generative adversarial network.

12. The computer implemented method of claim 11, further comprising applying the augmented frames of motion corrupted MRI data to a generator in the generative adversarial network to produce motion compensated images.

13. The computer implemented method of claim 12, further comprising training the generative adversarial network by applying the ground truth data, the augmented frames of motion-corrupted MRI data and the motion compensated images to a discriminator within the generative adversarial network.

14. The computer implemented method of claim 12, wherein the generative adversarial network is trained to minimize error functions evaluated according to differences between the ground truth data, the motion compensated images from the generator, and the augmented frames of motion corrupted MRI data.

15. A computer-implemented method of training a neural network to correct motion-induced errors in magnetic resonance images, comprising:
    acquiring original frames of motion free magnetic resonance image (MRI) data of a target object;
    using Fourier transforms to acquire respective original k-space data sets corresponding to each original frame;
    applying a respective spatial transformation matrix to each original k-space data set to acquire motion state data for each original k-space data set;
    replacing portions of each original k-space data set with the motion state data to produce a transformed k-space MRI data set having a respective motion state;
    combining the transformed k-space MRI data sets to produce a motion-corrupted k-space data set of MRI data;
    applying an inverse Fourier transform to the motion-corrupted k-space data set and forming respective synthetic motion corrupted frames of MRI data in the image domain; and
    using the synthetic motion corrupted frames of MRI data to train a neural network that generates output frames of motion compensated MRI data.

16. The computer-implemented method of claim 15, wherein applying the spatial transformation matrix comprises simulating in plane rigid motion artifacts from the original frames to produce the multiple frames of MRI data having the respective motion states.

17. The computer implemented method of claim 15, wherein the Fourier transform is a Fast Fourier Transform and the k-space data sets are Cartesian k-space data sets.

18. The computer implemented method of claim 15, wherein the Fourier transform is a Non-Uniform Fourier Transform and the k-space data sets are formed on spiral k-space trajectories.

19. The computer implemented method of claim 18, wherein replacing portions of each original k-space data set further comprises replacing selected spiral interleaves in a respective k-space data set.

20. The computer implemented method of claim 19, wherein replacing selected spiral interleaves comprises dividing all spiral interleaves in the motion-corrupted k-space data set into a selected number of sets, wherein each set is subject to a respective motion event corresponding to a respective spatial transformation matrix.

21. The computer-implemented method of claim 20, wherein a number of spiral interleaves in each of the sets is randomly selected from a group of numbers including 8, 16, 32, 64, and 128.

22. The computer implemented method according to claim 20, wherein a spatial transformation of the spiral interleaves comprises a type of spiral trajectory randomly selected from constant density, variable density, and dual density transformations.

23. The computer implemented method according to claim 20, wherein the number of sets is selected from 1, 2, 3, and 4 sets.

24. A non-transitory computer-readable medium having stored instructions that, when executed by one or more processors, cause a magnetic resonance imaging system to perform a computer implemented method that comprises:
   acquiring original frames of motion free magnetic resonance image (MRI) data of a target object;
   using Fourier transforms to acquire respective original k-space data sets corresponding to each original frame;
   applying a respective spatial transformation matrix to each original k-space data set to acquire motion state data for each original k-space data set;
   replacing portions of each original k-space data set with the motion state data to produce a transformed k-space MRI data set having a respective motion state;
   combining the transformed k-space MRI data sets to produce a motion-corrupted k-space data set of MRI data;
   applying an inverse Fourier transform to the motion-corrupted k-space data set and forming respective synthetic motion corrupted frames of MRI data in the image domain; and
   using the synthetic motion corrupted frames of MRI data to train a neural network that generates output frames of motion compensated MRI data.

25. A system for ungated magnetic resonance imaging, comprising:
   a magnetic resonance imaging device configured to produce magnetic resonance imaging (MRI) data corresponding to a target; and
   one or more processors in data communication with computer memory and the magnetic resonance imaging device, wherein the one or more processors are configured to cause the system to perform a computer implemented method comprising:
   acquiring original frames of motion free magnetic resonance image (MRI) data of a target object;
   using Fourier transforms to acquire respective original k-space data sets corresponding to each original frame;
   applying a respective spatial transformation matrix to each original k-space data set to acquire motion state data for each original k-space data set;
   replacing portions of each original k-space data set with the motion state data to produce a transformed k-space MRI data set having a respective motion state;
   combining the transformed k-space MRI data sets to produce a motion-corrupted k-space data set of MRI data;
   applying an inverse Fourier transform to the motion-corrupted k-space data set and forming respective synthetic motion corrupted frames of MRI data in the image domain; and
   using the synthetic motion corrupted frames of MRI data to train a neural network that generates output frames of motion compensated MRI data.

* * * * *